US009219215B1

(12) United States Patent
Yang et al.

(10) Patent No.: US 9,219,215 B1
(45) Date of Patent: Dec. 22, 2015

(54) NANOSTRUCTURES HAVING HIGH PERFORMANCE THERMOELECTRIC PROPERTIES

(71) Applicant: The Regents of The University of California, Oakland, CA (US)

(72) Inventors: Peidong Yang, El Cerrito, CA (US); Arunava Majumdar, Orinda, CA (US); Allon I. Hochbaum, Berkeley, CA (US); Renkun Chen, Berkeley, CA (US); Raul Diaz Delgado, Berkeley, CA (US)

(73) Assignee: The Regents of The University of California, Oakland, CA (US)

( * ) Notice: Subject to any disclaimer, the term of this patent is extended or adjusted under 35 U.S.C. 154(b) by 0 days.

(21) Appl. No.: 14/226,569

(22) Filed: Mar. 26, 2014

Related U.S. Application Data

(63) Continuation of application No. 12/673,366, filed as application No. PCT/US2008/073922 on Aug. 21, 2008, now Pat. No. 8,729,381.

(60) Provisional application No. 60/957,158, filed on Aug. 21, 2007, provisional application No. 61/016,276, filed on Dec. 21, 2007.

(51) Int. Cl.
*H01L 35/28* (2006.01)
*H01L 35/26* (2006.01)
*H01L 35/22* (2006.01)
*H01L 35/32* (2006.01)

(52) U.S. Cl.
CPC ............... *H01L 35/26* (2013.01); *H01L 35/22* (2013.01); *H01L 35/32* (2013.01)

(58) Field of Classification Search
None
See application file for complete search history.

(56) References Cited

U.S. PATENT DOCUMENTS

| | | | |
|---|---|---|---|
| 2,588,254 A | 3/1952 | Lark-Horovitz et al. | |
| 3,441,812 A | 4/1969 | Szabo et al. | |
| 4,251,286 A * | 2/1981 | Barnett | 136/260 |
| 4,493,939 A | 1/1985 | Blaske et al. | |
| 4,842,699 A | 6/1989 | Hua et al. | |
| 5,391,914 A | 2/1995 | Sullivan et al. | |
| 5,824,561 A | 10/1998 | Kishi et al. | |
| 5,837,929 A | 11/1998 | Adelman | |

(Continued)

FOREIGN PATENT DOCUMENTS

| | | |
|---|---|---|
| CN | 1352468 | 6/2002 |
| CN | 101009214 | 8/2007 |

(Continued)

OTHER PUBLICATIONS

Peng et al., Synthesis of large-area silicon nanowire arrays via self-assembling nanochemistry, Adv. Mater., 14, 1164-1167 (2002).*

(Continued)

*Primary Examiner* — Eli Mekhlin
(74) *Attorney, Agent, or Firm* — Weaver Austin Villeneuve & Sampson LLP

(57) ABSTRACT

The invention provides for a nanostructure, or an array of such nanostructures, each comprising a rough surface, and a doped or undoped semiconductor. The nanostructure is an one-dimensional (1-D) nanostructure, such a nanowire, or a two-dimensional (2-D) nanostructure. The nanostructure can be placed between two electrodes and used for thermoelectric power generation or thermoelectric cooling.

28 Claims, 8 Drawing Sheets

(56) References Cited

U.S. PATENT DOCUMENTS

| | | | |
|---|---|---|---|
| 5,950,067 A | 9/1999 | Maegawa et al. | |
| 6,300,150 B1 | 10/2001 | Venkatasubramanian | |
| 6,843,902 B1 | 1/2005 | Penner et al. | |
| 6,882,051 B2 * | 4/2005 | Majumdar et al. | 257/746 |
| 6,894,215 B2 | 5/2005 | Akiba | |
| 6,989,897 B2 | 1/2006 | Chan et al. | |
| 6,996,147 B2 | 2/2006 | Majumdar et al. | |
| 7,267,859 B1 | 9/2007 | Rabin et al. | |
| 7,361,313 B2 | 4/2008 | Chan et al. | |
| 7,569,202 B2 | 8/2009 | Farrell et al. | |
| 7,605,327 B2 | 10/2009 | Roscheisen et al. | |
| 7,713,778 B2 | 5/2010 | Li et al. | |
| 7,820,292 B2 | 10/2010 | Shcherbakov et al. | |
| 7,847,180 B2 | 12/2010 | Vidu et al. | |
| 8,044,294 B2 | 10/2011 | Park et al. | |
| 8,206,780 B2 | 6/2012 | Li et al. | |
| 8,729,381 B2 | 5/2014 | Yang et al. | |
| 8,736,011 B2 | 5/2014 | Yi et al. | |
| 9,051,175 B2 | 6/2015 | Matus et al. | |
| 9,082,930 B1 | 7/2015 | Wacker et al. | |
| 2002/0175408 A1 | 11/2002 | Majumdar et al. | |
| 2003/0041892 A1 | 3/2003 | Fleurial et al. | |
| 2003/0099279 A1 | 5/2003 | Venkatasubramanian et al. | |
| 2003/0184188 A1 | 10/2003 | Kucherov et al. | |
| 2003/0189202 A1 | 10/2003 | Li et al. | |
| 2004/0000333 A1 | 1/2004 | Chen et al. | |
| 2004/0042181 A1 | 3/2004 | Nagasaki | |
| 2004/0106203 A1 | 6/2004 | Stasiaik et al. | |
| 2004/0157354 A1 | 8/2004 | Kuriyama et al. | |
| 2004/0161369 A1 | 8/2004 | Chan et al. | |
| 2004/0251539 A1 | 12/2004 | Faris et al. | |
| 2004/0261830 A1 | 12/2004 | Sharp et al. | |
| 2005/0045702 A1 * | 3/2005 | Freeman et al. | 228/254 |
| 2005/0060884 A1 | 3/2005 | Okamura et al. | |
| 2005/0064185 A1 | 3/2005 | Buretea et al. | |
| 2005/0098204 A1 | 5/2005 | Roscheisen et al. | |
| 2005/0110064 A1 | 5/2005 | Duan et al. | |
| 2005/0112872 A1 | 5/2005 | Okamura | |
| 2005/0224790 A1 | 10/2005 | Jin et al. | |
| 2005/0241690 A1 | 11/2005 | Tajima et al. | |
| 2006/0000502 A1 | 1/2006 | Fiorini et al. | |
| 2006/0076046 A1 | 4/2006 | Ghoshal et al. | |
| 2006/0118158 A1 | 6/2006 | Zhang et al. | |
| 2006/0118513 A1 | 6/2006 | Faure et al. | |
| 2006/0151820 A1 | 7/2006 | Duan et al. | |
| 2006/0157101 A1 | 7/2006 | Sakamoto et al. | |
| 2006/0159916 A1 | 7/2006 | Dubrow et al. | |
| 2006/0172116 A1 | 8/2006 | Den et al. | |
| 2006/0215154 A1 | 9/2006 | Chan et al. | |
| 2006/0233692 A1 | 10/2006 | Scaringe et al. | |
| 2006/0251561 A1 | 11/2006 | Farrell et al. | |
| 2006/0254501 A1 | 11/2006 | Wang et al. | |
| 2006/0266402 A1 | 11/2006 | Zhang et al. | |
| 2007/0025658 A1 | 2/2007 | Fukai et al. | |
| 2007/0128773 A1 | 6/2007 | Baskaran | |
| 2007/0131269 A1 | 6/2007 | Dutta | |
| 2007/0132043 A1 | 6/2007 | Bradley et al. | |
| 2007/0261730 A1 | 11/2007 | Seker et al. | |
| 2008/0006843 A1 | 1/2008 | Dai et al. | |
| 2008/0060695 A1 | 3/2008 | Brignone | |
| 2008/0093698 A1 | 4/2008 | Tsakalakos et al. | |
| 2008/0121263 A1 | 5/2008 | Schutte et al. | |
| 2008/0142066 A1 | 6/2008 | Plissonnier et al. | |
| 2008/0149914 A1 | 6/2008 | Samelson et al. | |
| 2008/0173344 A1 | 7/2008 | Zhang et al. | |
| 2008/0178920 A1 | 7/2008 | Ullo | |
| 2008/0178921 A1 | 7/2008 | Ye | |
| 2008/0230802 A1 | 9/2008 | Bakkers et al. | |
| 2008/0268233 A1 | 10/2008 | Lawin et al. | |
| 2008/0299381 A1 | 12/2008 | Zhang et al. | |
| 2008/0308140 A1 | 12/2008 | Nakamura | |
| 2009/0004086 A1 | 1/2009 | Kuhling et al. | |
| 2009/0020148 A1 | 1/2009 | Boukai et al. | |
| 2009/0096109 A1 | 4/2009 | Iwasaki | |
| 2009/0117741 A1 | 5/2009 | Heath et al. | |
| 2009/0140145 A1 | 6/2009 | Ouvrier-Buffet et al. |
| 2009/0174038 A1 | 7/2009 | Wang |
| 2009/0214848 A1 | 8/2009 | Sands et al. |
| 2009/0236317 A1 | 9/2009 | Yost et al. |
| 2010/0068871 A1 | 3/2010 | Tian et al. |
| 2010/0072461 A1 | 3/2010 | Hannebauer |
| 2010/0078055 A1 | 4/2010 | Vidu et al. |
| 2010/0147350 A1 | 6/2010 | Chou |
| 2010/0147371 A1 | 6/2010 | Cho |
| 2010/0162728 A1 | 7/2010 | Lee |
| 2010/0233518 A1 | 9/2010 | Kwon et al. |
| 2010/0236596 A1 | 9/2010 | Lee et al. |
| 2010/0261013 A1 | 10/2010 | Duan et al. |
| 2010/0272993 A1 | 10/2010 | Volinsky et al. |
| 2010/0319759 A1 | 12/2010 | Fisher et al. |
| 2011/0000708 A1 | 1/2011 | Nakai et al. |
| 2011/0059568 A1 | 3/2011 | Chao et al. |
| 2011/0065223 A1 | 3/2011 | Hannebauer |
| 2011/0114145 A1 | 5/2011 | Yang et al. |
| 2011/0114146 A1 | 5/2011 | Scullin |
| 2011/0233512 A1 | 9/2011 | Yang et al. |
| 2011/0266521 A1 | 11/2011 | Ferrari et al. |
| 2011/0304004 A1 | 12/2011 | Park |
| 2012/0037591 A1 | 2/2012 | Tringe et al. |
| 2012/0040512 A1 | 2/2012 | Li et al. |
| 2012/0049315 A1 | 3/2012 | Kim et al. |
| 2012/0126449 A1 | 5/2012 | Hart et al. |
| 2012/0152295 A1 | 6/2012 | Matus et al. |
| 2012/0247527 A1 | 10/2012 | Scullin et al. |
| 2012/0282435 A1 | 11/2012 | Yang et al. |
| 2012/0295074 A1 | 11/2012 | Yi et al. |
| 2012/0319082 A1 | 12/2012 | Yi et al. |
| 2013/0000688 A1 | 1/2013 | Cho et al. |
| 2013/0019918 A1 | 1/2013 | Boukai et al. |
| 2013/0037070 A1 | 2/2013 | Narducci et al. |
| 2013/0042899 A1 | 2/2013 | Wirtz et al. |
| 2013/0069194 A1 | 3/2013 | Marinescu et al. |
| 2013/0081662 A1 | 4/2013 | Dibra |
| 2013/0161834 A1 | 6/2013 | Pan |
| 2013/0175654 A1 | 7/2013 | Muckenhirn et al. |
| 2013/0186445 A1 | 7/2013 | Lorimer et al. |
| 2013/0187130 A1 | 7/2013 | Matus et al. |
| 2013/0241026 A1 | 9/2013 | Or-Bach et al. |
| 2013/0267046 A1 | 10/2013 | Or-Bach et al. |
| 2014/0024163 A1 | 1/2014 | Aguirre et al. |
| 2014/0116491 A1 | 5/2014 | Reifenberg et al. |
| 2014/0182644 A1 | 7/2014 | Aguirre et al. |
| 2014/0193982 A1 | 7/2014 | Yi et al. |
| 2014/0318593 A1 | 10/2014 | Venkatasubramanian et al. |
| 2014/0329389 A1 | 11/2014 | Matus et al. |

FOREIGN PATENT DOCUMENTS

| | | |
|---|---|---|
| CN | 101156255 | 4/2008 |
| EP | 687020 | 12/1995 |
| EP | 1426756 | 6/2004 |
| JP | 2004-532133 | 10/2004 |
| JP | 2006-332188 | 12/2006 |
| JP | 5524839 | 4/2014 |
| RU | 2296055 | 11/2006 |
| WO | 00/08693 | 2/2000 |
| WO | 02/080280 | 10/2002 |
| WO | 2005/119800 | 12/2005 |
| WO | 2006/062582 | 6/2006 |
| WO | 2009/014985 | 1/2009 |
| WO | 2009/026466 | 2/2009 |
| WO | 2009/125317 | 10/2009 |
| WO | 2010/004550 | 1/2010 |
| WO | 2010/018893 | 2/2010 |
| WO | 2015/021467 | 2/2015 |

OTHER PUBLICATIONS

Zhang, Xin-Yi et al., "Synthesis of ordered single crystal silicon nanowire arrays," Adv. Mater. 2001, No. 16, Aug. 16, 2001.

DiSalvo, Francis J., "Thermoelectric cooling and power generation," Science vol. 285, Jul. 30, 1999.

JP patent application No. 2010-522040, Notice of Allowance mailed Mar. 11, 2014.

(56) References Cited

OTHER PUBLICATIONS

U.S. Appl. No. 12/673,366, Office Action mailed May 1, 2013.
U.S. Appl. No. 12/673,366, Office Action mailed Sep. 26, 2013.
U.S. Appl. No. 12/673,366, Notice of Allowance mailed Jan. 24, 2014.
KR patent application No. 10-2010-7003922, Office Action mailed Jul. 21, 2014.
CN patent application No. 200880113050.3, Notification to Grant mailed Jul. 22, 2014.
JP patent application No. 2010-522040, Office Action mailed Mar. 5, 2013.
CN patent application No. 200880113050.3, Office Action mailed Oct. 24, 2011.
CN patent application No. 200880113050.3, Office Action mailed Sep. 5, 2012.
CN patent application No. 200880113050.3, Office Action mailed Mar. 5, 2013.
RU patent application No. 2010110307/04, Office Action mailed Jun. 1, 2012.
EP patent application No. 08827590, Supplemental Search Report mailed Aug. 5, 2013.
EP patent application No. 10163141, Search Report mailed Aug. 20, 2013.
WO patent application No. PCT/US08/73922, International Search Report mailed Dec. 23, 2008.
Li, D. et al., "Thermal conductivity of individual silicon nanowires", Appl. Phys. Lett. 83, 2934-2936 (2003) Oct. 6, 2003.
Weber, L. & Gmelin, E., "Transport properties of silicon", Appl. Phys. A 53, 136-140 (1991) Mar. 1, 1991.
Peng et al., "Synthesis of large-area silicon nanowire arrays via self-assembling nanochemistry", Adv. Mater. 14, 1164-1167 (2002) Aug. 16, 2002.
Peng et al., "Dendrite-assisted growth of silicon nanowires in electroless metal deposition", Adv. Funct. Mater. 13, 127-132 (2003) Feb. 2003.
Peng et al., "Uniform, axial-orientation alignment of one-dimensional single-crystal silicon nanostructure arrays", Angew. Chem. Int. Edit. 44, 2737 (2005) Dec. 20, 2004.
Peng et al., "Aligned single-crystalline Si nanowire arrays for photovoltaic applications", small, 1(11): 1062-1067 (2005) Apr. 26, 2005.
A. Tao, F. Kim, C. Hess, J. Goldberger, R. He, Y. Sun, Y. Xia, P. Yang, "Langmuir-Blodgett silver nanowire monolayers for molecular sensing using surface-enhanced raman spectroscopy", Nano. Lett. 3, 1229, (2003) Jun. 18, 2003.
Asheghi, M., Leung, Y.K., Wong, S.S. & Goodson, K.E. "Phonon-boundary scattering in thin silicon layers", Appl. Phys. Lett. 71, 1798-1800 (1997) Sep. 29, 2007.
Asheghi, M., Touzelbaev, Goodson, K.E., Leung, Y.K. & Wong, S.S., "Temperature-dependent thermal conductivity of single crystal silicon layers in SOI substrates", J.Heat Transf. 120, 30-36 (1998) Feb. 1998.
Ju, Y.S. & Goodson, K.E., "Phonon scattering in silicon films with thickness of order 100 nm.", Appl. Phys. Lett. 74 3005-0337 (1999) May 17, 1999.
Hochbaum, A.I., Fan, R., He, R. & Yang, P. "Controlled growth of Si nanowire arrays for device integration", Nano Lett. 5, 457-460 (2005) Dec. 3, 2004.
Shi, L., et al., "Measuring thermal and thermoelectric properties of one-dimensional nanostructures using a microfabricated device", J. Heat Transf. 125, 881-888 (2003) Oct. 2003.
Majumdar, A., "Thermoelectricity in semiconductor nanostructures", Science 303 777-778 (2004) Feb. 6, 2004.
Hsu, K.F. et al. "Cubic $AgPb_mSbTe_{2+m}$: bulk thermoelectric materials with high figure of merit", Science 303, 818-821 (2004) Feb. 6, 2004.
Harman, T.C., Taylor, P.J., Walsh, M.P. & LaForge, B.E., "Quantum dot superlattice thermoelectric materials and evices", Science 297, 2229-2232 (2002) Sep. 27, 2002.
Venkatasubramanian, R., Siivola, E., Colpitts, T. & O'Quinn, B. "Thin-film thermoelectric devices with high room-temperature figures of merit", Nature 413 597-602 (2001) Oct. 11, 2001.
Kim, W. et al., "Thermal conductivity reduction and thermoelectric figure of merit increase by embedding nanoparticles in crystalline semiconductors", Phys. Rev. Lett. 96, 045901-1-045901-4 (2006) Feb. 3, 2006.
Zou, J. & Balandin, A., "Phonon heat conduction in a semiconductor", Nanowire. J. App. Phys. 89, 2932-2938 (2001) Mar. 1, 2001.
Brinson, M.E. & Dunstan, W., "Thermal conductivity and thermoelectric power of heavily doped n-type silicon", J. Phys. C 3, 483-491 (1970) Jul. 18, 1969.
Ruf, T. et al., "Thermal conductivity of isotopically entriched silicon", Solid State Commun. 115, 243-247 (2000) Mar. 17, 2000.
Cahill, D.G. & Pohl, R.O., "Thermal conductivity of amorphous solids above the plateau", Phys. Rev. B 35, 4067-4073 (1987) Mar. 15, 1987.
Geballe, T.H. & Hull, G.W., "Seebeck effect in silicon", Phys. Rev. 98, 940 (1955) May 15, 1955.
Van Herwaarden, A.W., "The seebeck effect in silicon Ics.", Sensors and Actuators, 6, 245-254 (1984) Jun. 5, 1984.
U.S. Appl. No. 13/331,768, Office Action mailed Oct. 6, 2015.
U.S. Appl. No. 12/943,134, Office Action mailed Sep. 25, 2015.
EP patent application No. 12790253, Supplementary European Search Report, mailed Sep. 29, 2015.
U.S. Appl. No. 13/299,179, Office Action mailed Sep. 23, 2015.
U.S. Appl. No. 13/430,558, Office Action mailed Apr. 24, 2014.
U.S. Appl. No. 13/430,558, Office Action mailed Jan. 30, 2015.
U.S. Appl. No. 13/430,558, Office Action mailed Jun. 29, 2015.
U.S. Appl. No. 13/308,945, Office Action mailed Aug. 2, 2013.
U.S. Appl. No. 13/308,945, Notice of Allowance mailed Dec. 11, 2013.
U.S. Appl. No. 13/308,945, Corrected Notice of Allowance mailed Apr. 24, 2014.
U.S. Appl. No. 13/331,768, Office Action mailed Jan. 20, 2015.
U.S. Appl. No. 13/364,176, Office Action mailed Jan. 27, 2014.
U.S. Appl. No. 13/364,176, Office Action mailed Sep. 8, 2014.
U.S. Appl. No. 13/364,176, Office Action mailed Apr. 29, 2015.
U.S. Appl. No. 12/943,134, Office Action mailed Nov. 18, 2013.
U.S. Appl. No. 12/943,134, Office Action mailed May 22, 2014.
U.S. Appl. No. 12/943,134, Office Action mailed Jan. 21, 2015.
U.S. Appl. No. 13/299,179, Office Action mailed Feb. 26, 2015.
U.S. Appl. No. 13/760,977, Office Action mailed Apr. 1, 2014.
U.S. Appl. No. 13/760,977, Office Action mailed Dec. 2, 2014.
U.S. Appl. No. 13/760,977, Office Action mailed Jun. 17, 2015.
U.S. Appl. No. 13/786,090, Notice of Allowance mailed Oct. 9, 2014.
U.S. Appl. No. 13/786,090, Notice of Allowance mailed Feb. 9, 2015.
U.S. Appl. No. 13/947,400, Office Action mailed Oct. 3, 2014.
U.S. Appl. No. 13/947,400, Notice of Allowance mailed Mar. 24, 2015.
U.S. Appl. No. 14/059,362, Notice of Allowance mailed Jan. 8, 2015.
U.S. Appl. No. 14/059,362, Notice of Allowance mailed Mar. 6, 2015.
U.S. Appl. No. 14/203,360, Office Action mailed Jun. 10, 2014.
U.S. Appl. No. 14,203,360, Notice of Allowance mailed Sep. 18, 2014.
U.S. Appl. No. 14/203,360, Office Action mailed Jan. 26, 2015.
U.S. Appl. No. 14/203,360, Notice of Allowance mailed Jul. 21, 2015.
U.S. Appl. No. 14/333,197, Notice of Allowance mailed May 1, 2015.
U.S. Appl. No. 14/333,197, Notice of Allowance mailed Aug. 18, 2015.
CN patent application No. 200880113050.3, Office Action mailed Aug. 26, 2013.
CN patent application No. 201010157086.0, Office Action mailed Dec. 18, 2013.
CN patent application No. 201180065569.0, Office Action mailed Aug. 3, 2015.
CN patent application No. 201180066221.3, Office Action mailed May 5, 2015.
EP patent application No. 10830715.8, Supplementary European Search Report mailed Jun. 10, 2014.

(56) References Cited

OTHER PUBLICATIONS

EP patent application No. 11845164.0, Supplementary European Search Report mailed Nov. 6, 2014.
EP patent application No. 11841453.1, Supplementary European Search Report mailed Nov. 28, 2014.
JP patent application No. 2010-522040, Office Action mailed Oct. 15, 2013.
JP patent No. 5524839, Certificate of Patent, registered Apr. 18, 2014.
JP patent application No. 2014-081075, Office Action mailed Apr. 28, 2015.
KR patent application No. 10-2010-7003922, Notice of Refusal mailed Jan. 20, 2015.
KR patent application No. 10-2015-7007656, Notification of Provisional Rejection mailed Jun. 12, 2015.
KR patent application No. 10-2015-7007657, Notification of Provisional Rejection mailed Jun. 12, 2015.
RU patent application No. 2010110307/04, Resolution on Granting Patent mailed Sep. 11, 2013.
WO patent application No. PCT/US08/73922, Written Opinion mailed Dec. 23, 2008.
WO patent application No. PCT/US2010/056356, International Search Report mailed Jun. 3, 2011.
WO patent application No. PCT/US2010/056356, Written Opinion mailed Jun. 3, 2011.
WO patent application No. PCT/US2011/061301, International Search Report mailed Jan. 31, 2013.
WO patent application No. PCT/US2011/061301, Written Opinion mailed Jan. 31, 2013.
WO patent application No. PCT/US2011/63000, International Search Report mailed Apr. 3, 2012.
WO patent application No. PCT/US2011/63000, Written Opinion mailed Apr. 3, 2012.
WO patent application No. PCT/US2011/066108, International Search Report mailed Apr. 26, 2012.
WO patent application No. PCT/US2011/066108, Written Opinion mailed Apr. 26, 2012.
WO patent application No. PCT/US2012/023425, International Search Report mailed Sep. 4, 2012.
WO patent application No. PCT/US2012/023425, Written Opinion mailed Sep. 4, 2012.
WO patent application No. PCT/US2013/025060, International Search Report mailed Apr. 15, 2013.
WO patent application No. PCT/US2013/025060, Written Opinion mailed Apr. 15, 2013.
WO patent application No. PCT/US15/25075, International Search Report mailed Aug. 4, 2015.
WO patent application No. PCT/US15/25075, Written Opinion mailed Aug. 4, 2015.
Ashcroft, N.W. et al., "Solid State Physics," Chapters 1, 2 and 13 (Saunders College Publishing, Fort Worth, 1976).
Bell, Lon E., "Cooling, heating, generating power, and recovering waste heat with thermoelectric systems," Science vol. 321, Sep. 12, 2008.
Ben-Chorin et al., "Hopping transport on a fractal: ac conductivity of porous silicon," Physical Review B, vol. 51, No. 4, pp. 2199-2213, Jan. 15, 1995.
Benecke, Wolfgang et al., "MEMS applications of porous silicon," Proceedings SPIE 4592, Device and Process Technologies for MEMS and Microelectronics II, 76: doi:10.1117/12.449009, 12 pages (Nov. 21, 2011).
Bhandari, C.M. et al., "Optimization of Carrier Concentration," Chapter 5 from CRC Handbook of Thermoelectrics, CRC Press, Boca Raton (1995).
Bogush, G.H. et al., "Preparation of monodisperse silica particles: control of size and mass fraction," Journal of Non-Crystalline Solids 104 (1988) 95-106.
Boukai, Akram I. et al., "Silicon nanowires as efficient thermoelectric materials," Nature, vol. 451, Jan. 2008.

Bux, Sabah K. et al., "Nanostructured bulk silicon as an effective thermoelectric material," Advanced Functinal Materials 2009, 19, 2445-2452.
Cahill, D.G. "Lower limit to the thermal conductivity of disordered crystals," Physical Review B, vol. 46, No. 10, Sep. 1, 1992.
Chartier et al., "Metal-assisted chemical etching of silicon in HF-H2O2," Electrochimica Acta, 53 (2008) pp. 5509-5516.
Chen et al., (2008) "Thermal conductance of thin silicon nanowires," Physical Review Letters, 101:105501-1-105501.4.
Chen Huan et al., "Wafer-scale synthesis of single-crystal zigzag silicon nanowire arrays with controlled turning angles," NanoLetters 10: 864-868 (2010) abstract.
Chen et al., (2011) "Vertically-aligned of sub-millimeter ultralong Si nanowire arrays and its reduced phonon thermal conductivity," Journal of the Electrochemical Society, 158(5): D302-D306.
Cheng, S.L. et al., "Fabrication of vertically aligned silicon nanowire arrays and investigation on the formation of the nickel silicide nanowires," presented at the 2007 IEEE Conference on Electron Devices and Solid-State Circuit held Dec. 20-22, 2007 (abstract).
Chiappini, Ciro et al., "Biodegradable porous silicon barcode nanowires with defined geometry," Adv. Funct. Mater. 20: 2231-2239 (2010).
Chiritescu, Catalin et al., "Ultralow thermal conductivity in disordered, layered Wse2 crystals," Science, vol. 315, pp. 351-353, Jan. 19, 2007.
Cui, Yi et al., "High performance silicon nanowire field effect transistors," Nao Letters 2003, vol. 3, No. 2, 149-152.
Douani et al., (2011) "Formation of a-SI:H and a-SiI-xCx :H Nanowires by Ag-Assisted Electroless Etching in Aqueous HF/AgNO3 Solution," Thin Solid Films, 519:5383-5387.
Electron Microscopy Sciences, Colloidal Compounds and Conductive Adhesives, Jan. 25, 2011; [Retrieved on Aug. 13, 2012] from the Internet <URL:http://web.archive.org/web/20110125172854/http://emsdiasum.com/microscopy/products/sem/colloidal.aspx>. pp. 1-16.
Engineering Toolbox, "Thermal Conductivity of Metals," Engineering ToolBox.com [Retrieved online on Jan. 22, 2014], from the Internet <URL:http://www.engineeringtoolbox.com/thermal-conductivity-metals-d_858.html>, pp. 1-8.
Evanoff et al., (2005) "Synthesis and optical properties of silver nanoparticles and arrays," ChemPhysChem, 6:1221-1231.
Fang et al., (2006) "Silver catalysis in the fabrication of silicon nanowire arrays," Nanotechnology, 17:3768-3774.
Gao et al., (2005) "Selective growth of Si nanowire arrays via galvanic displacement processes in water-in-oil microemulsions," J. Am. Chem. Soc., 127:4574-4575.
Gesele, G. et al., "Temperature-dependent thermal conductivity of porous silicon," J. Phys. D: Appl. Phys. 30 (1997) 2911-2916 May 19, 1997.
Gielis et al., "Silver-assisted electroless etching of Si nanowaire," Abstract #1971, presented Oct. 11, 2010 at the 218th ECS meeting (held in Las Vegas, NV, Oct. 10-15, 2010), 1 page.
Haick, Hossam et al., "Electrical characteristics and chemical stability of non-oxidized, methyl-terminated silicon nanowires," J. Am. Chem. Soc. 2006, 128, 8990-8991, Oct. 4, 2005.
Hao, Qing et al., "Frequency-dependent Monte Carlo simulations of phonon transport in two-dimensional porous silicon with aligned pores," Journal of Applied Physics 106, 114321 (2009).
Heitsch et al., (2008), "Solution-liquid-solid (SLS) growth of silicon nanowires," J. Am. Chem. Soc., 130:5436-5437.
Hochbaum et al., "Enhanced thermoelectric performance of rough silicon nanowires," Nature, 451:163-167, Jan. 10, 2008.
Hochbaum, Allon I. et al., "Single crystalline mesoporous silicon nanowires," Nano Letters 2009, vol. 9, No. 10, 3550-3554.
Huang, Zhipeng et al., "Metal-assisted chemical etching of silicon: a review," Adv. Mater. 23: 285-308 (2011).
Huang, Zhipeng et al., "Oxidation rate effect on the direction of metal-assisted chemical and electrochemical etching of silicon," J. Phys. Chem. C 2010, 114, 10683-10690.
Huang, Yuan et al., "Synthesis of uniform, spherical sub-100 nm silica particles using a conceptual modification of the classic LaMer model," Colloids and Surfaces A: Physicochemical and engineering aspects, 360 (2010) 175-183.

(56) References Cited

OTHER PUBLICATIONS

Infineon, "Introduction to power dissipation and thermal resistance," Infineon.com [Retrieved online on Jan. 22, 2014], from the Internet <URL:http://www.btipnow.com/events/ppt/Ch4%20Intro%20Power%20Diss%20Thermal%20Res.ppt>, pp. 1-67.

Kim, Jungkil et al., "Curved silicon nanowires with ribbon-like cross sections by metal-assisted chemical etching," ACS Nano 5(6): 5242-5248 (2011).

Kim, Namsu et al., "Thermal transport properties of thin films of small molecule organic semiconductors," Applied Physics Letters 87, 241908 (2005).

Kolasinski, Kurt W., (2005) "Silicon nanostructures from electroless electrochemical etching," Current Opinion in Solid State and Materials Science, 9 (1-2): 73-83.

Lee, Kyoung G. et al., "Scalable nanopillar arrays with layer-by-layer patterned overt and covert images," Adv. Mater. 2014, 26, 6119-6124.

Majumdar, A., "Lower limit of thermal conductivity: diffusion versus localization," Technical discussion, Microscale Thermophysical Engineering, 2:5-9, 1998 © 1998 Taylor & Francis 1089-3954/98.

Masetti, G. et al., "Modeling of carrier mobility against carrier concentration in arsenic-, phosphorus-, and boron-doped silicon," IEEE Transactions on Electron Device, 30(7):764-769 (1983).

Mathur, R.G. et al., "Thermoelectric power in porous silicon," Journal of Applied Physics, vol. 83, No. 11, Jun. 1, 1998.

Mingo, Natalio et al., "Predicting the thermal conductivity of Si and Ge nanowires," Nano Letters 2003 vol. 3, No. 12, 1713-1716.

Morinaga et al., (Oct. 1994) "Mechanism of metallic particle growth and metal-induced pitting on Si wafer surface in wet chemical process," J. Electrochem. Soc., 141 (10): 2834-2841.

Nahm et al., (1995) "Mechanism of silicon etching in Etching in HF—KMnO4—H2O Solution," Korean J. of Chem. Eng., 12(2):162-167.

Nolas, G.S. et al., Thermoelectrics: basic principles and new materials development (eds Nolas, G.S.; Sharp, J. & Goldsmid, H.J.) Ch. 3 (Springer, Berlin 2001).

Park, Soojin et al., "Fabrication of highly ordered silicon oxide dots and stripes from block copolymer thin films," Advanced materials 2008, 20, 681-685.

Parkhutik, V.P., "Oscillations of open-circuit potential during immersion plating of silicon in CuSO4/HF solutions," Russian Journal of Electrochemistry, 42(5) (2006) pp. 512-522.

Peng et al., "Fabrication of single-crystalline silicon nanowires by scratching a silicon surface with catalytic metal particles," Adv. Funct. Mater. 16: 387-394 (2006).

Peng, K. et al., "Motility of metal nanoparticles in silicon and induced anisotropic silicon etching," Advanced Functional Materials, 18 (2008)pp. 3026-3035.

Rokugawa, Hiroshi et al., "An etchant system, Ag2CrO4—HF—H2O, for highly aligned Si nanowire fabrication," Journal of the Electrochemical Society, 157 (8) K157-K161 (2010).

Rutten, O.W.J.S. et al., "The electrochemical reduction of nitrate in acidic nitrate solutions," Journal of Applied Electrochemistry 29 (1999) 87-92.

Ryckman, Judson D. et al., "Direct imprinting of porous substrates: a rapid and low-cost approach for patterning porous nanomaterials," Nano Lett. 2011, 11, 1857-1862.

Saha, Sanjoy et al., "Monte Carlo simulation of phonon backscattering in a nanowire," Proceedings of IMECE 2006, ASME International Mechanical Engineering Congress and Exposition, Nov. 5-10, 2006.

Sailor, Michael J., "Fundamentals of porous silicon preparation," Chapter 1, pp. 1-41, Porous Silicon in Practice: Preparation, characterization and applications, First Edition, Wiley-VCH Verlag GmbH & Co., KGaA (2012).

Shi, L. et al., "Measuring thermal and thermoelectric properties of one-dimensional nanostructures using a microfabricated device," J. Heat Transf. 125, 881-888 (2003) Oct. 2003.

Sivakov, V.A. et al., "Realization of vertical and zigzag single crystalline silicon nanowire architectures," J. Phys. Chem. C, 114 (2010) pp. 3798-3803.

Snyder, G. Jeffrey et al., "Complex thermoelectric materials," Nature Materials, vol. 7, pp. 105-112, Feb. 2008.

Stewart, Matthew E. et al., "Nanostructured plasmonic sensors," Chem. Rev. 2008, 108, 494-521.

Stober, Werner et al., "Controlled growth of monodisperse silica spheres in the micron size range," Journal of Colloid and Interface Science 26, 62-69 (1968).

Swartz et al., "Thermal boundary resistance," Reviews of Modern Physics, vol. 61, No. 3, pp. 605-668, Jul. 1989.

Sze, S.M., "Physics and properties of semiconductors—a resume," Chapter 1, Physics of Semiconductor Devices, John Wiley & sons, Inc., New York (1981).

Tang, Jinyao et al., "Holey silicon as an efficient thermoelectric material," Nano Lett. 2010, 10, 4279-4283.

Touloukian, Y.S. et al., "Thermal conductivity: metallic elements and alloys, thermophysical properties of matter," vol. 1, IFI/Plenum, New York, 339 (1970).

Tritt, Terry M. et al., "Thermoelectrics: direct solar thermal energy conversion," MRS Bulletin, vol. 33, Apr. 2008.

Vazquez-Mena, O. et al., "Metallic nanowires by full wafer stencil lithography," Nano Letters, 2008, vol. 8, No. 11, 3675-3682, Aug. 11, 2008.

Wang, Dunwei et al., "Complementary symmetry silicon nanowire logic: power-efficient inverters with gain," Small, vol. 2, No. 10, pp. 1153-1158, 2006.

Wang, Wei et al., "A new type of low power thermoelectric microgenerator fabricated by nanowire array thermoelectric material," Microelectronic Engineering 77 (2005) 223-229.

Weiss, R.A. et al., "Nanoparticle-textured surfaces from spin coating," Langmuir 2008, 24, 5218-5220.

Wilson, Jim, "Thermal conductivity of solders," downloaded from http://www.electronics-cooling.com/2006/08/thermal-conductivity-of-solders/.

Yamamoto, Atsushi et al., "Thermoelectric transport properties of porous silicon nanostructure," 18th International Conference on Thermoelectrics (1999) © 2000 IEEE 0-7803-5451-6/00.

Yang, Jihui et al., "Thermoelectric materials for space and automotive power generation," MRS Bulletin, vol. 31, pp. 224-229, Mar. 2006.

Yoo, Dai-Hwang et al., "Thermal conductivity of Al2O3/water nanofluids," Journal of the Korean Physical Society, 51 (Oct. 2007), pp. S84-S87.

Zandi, K. et al., "Study of bulk micromachining for (100) silicon," Dur. Phys. J. Appl. Phys., 35 (2006) pp. 7-12.

U.S. Appl. No. 13/364,176, Office Action mailed Oct. 20, 2015.

EP patent application no. 11841453.1, Exam Report mailed Oct. 9, 2015.

\* cited by examiner ated by the skilled artisan from the following description of illustrative embodiments when read in conjunction with the accompanying drawings.

NANOSTRUCTURES HAVING HIGH PERFORMANCE THERMOELECTRIC PROPERTIES

CROSS REFERENCE TO RELATED APPLICATION

This application is a continuation of prior application Ser. No. 12/673,366 filed on Jan. 12, 2011, titled NANOSTRUCTURES HAVING HIGH PERFORMANCE THERMOELECTRIC PROPERTIES, now issued as U.S. Pat. No. 8,729,381, which is a 371 of International Application No. PCT/US2008/073922, filed Aug. 21, 2008, titled NANOSTRUCTURES HAVING HIGH PERFORMANCE THERMOELECTRIC PROPERTIES, which claims benefit of provisional Application No. 60/957,158, filed Aug. 21, 2007. International Application No. PCT/US2008/073922 also claims benefit of provisional Application No. 61/016,276, filed Dec. 21, 2007.

Each of these prior applications is incorporated herein by reference in its entirety and for all purposes.

STATEMENT OF GOVERNMENTAL SUPPORT

The invention described and claimed herein was made in part utilizing funds supplied by the U.S. Department of Energy under Contract No. DE-AC02-05CH11231. The government has certain rights in this invention.

FIELD OF THE INVENTION

This invention relates generally to nanostructures.

BACKGROUND OF THE INVENTION

Currently, approximately 90 percent of the world's power ($\sim 10^{13}$ Watts or 10 TW) is generated by heat engines that use fossil fuel combustion as a heat source and typically operate at 30-40 percent efficiency, such that roughly 15 TW of heat is lost to the environment. Thermoelectric modules can potentially convert this low-grade waste heat to electricity, which could result in significant fuel savings and reduction in carbon emissions. Their efficiency depends on the thermoelectric figure of merit (ZT) of their material components, which is defined as $ZT=S^2 \sigma T/k$ where S, $\sigma$, k, and T are the Seebeck coefficient, electrical conductivity, thermal conductivity and absolute temperature, respectively. Over the past five decades, however, it has been challenging to increase ZT>1, since the parameters of ZT are generally interdependent. Nanostructured thermoelectric materials based on compounds of Bi, Te, Pb, Sb, and Ag have already been shown to increase ZT>1.

U.S. Pat. Nos. 6,882,051 and 6,996,147 disclose one-dimensional nanostructures having uniform diameters of less than approximately 200 nm. These nanostructures include single-crystalline homostructures as well as heterostructures of at least two single-crystalline materials having different chemical compositions.

SUMMARY OF THE INVENTION

The invention provides for a novel nanostructure comprising a rough surface, wherein the nanostructure comprises a doped or undoped semiconductor.

The invention also provides for a device comprising a nanostructure comprising a rough surface, wherein the nanostructure comprises a doped or undoped semiconductor and the nanostructure contacts a first electrode and a second electrode.

The invention also provides for a method of creating an electric current comprising: providing a device of the present invention, and setting up a temperature gradient between the first and second electrodes, such that an electric current is created that flows from the first electrode to the nanostructure, and through the nanostructure to the second electrode.

The invention further provides for a device comprising: a first electrode; a second electrode; a third electrode; a first plurality of nanostructures each comprising a rough surface, wherein each nanostructure comprises Si, Ge, or a combination thereof, doped with a valence-three element (such that the nanostructure comprises a p-type semiconductor); and, a second plurality of nanostructures each comprising a rough surface, wherein the nanostructure comprises Si, Ge, or a combination thereof, doped with a valence-five element (such that the nanostructure comprises a n-type semiconductor); wherein the first plurality of nanostructures contacts the first electrode and the third electrode, the second plurality of nanostructures contacts the first electrode and the second electrode; such that when the first electrode has a higher temperature than the second and third electrodes an electric current is created that flows from the second electrode to the second plurality of nanostructures, through the second plurality of nanostructures to the first electrode, through first electrode to the first plurality of nanostructures, through the first plurality of nanostructures to the third electrode.

The invention further provides for a method of creating an electric current comprising: providing the device of the present invention having a first plurality of nanostructures and a second plurality of nanostructures, and increasing the temperature of the first electrode; such that an electric current is created that flows from the second electrode to the second plurality of nanostructures, through the second plurality of nanostructures to the first electrode, through first electrode to the first plurality of nanostructures, through the first plurality of nanostructures to the third electrode.

The invention also provides for a method of decreasing the temperature of a locality comprising providing a device of the present invention, and applying an electric current through the device; such that the temperature of the first electrodes is decreased, wherein the first electrode is at or near the locality, and the temperature of the second and third electrodes is increased.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

Figure 1:
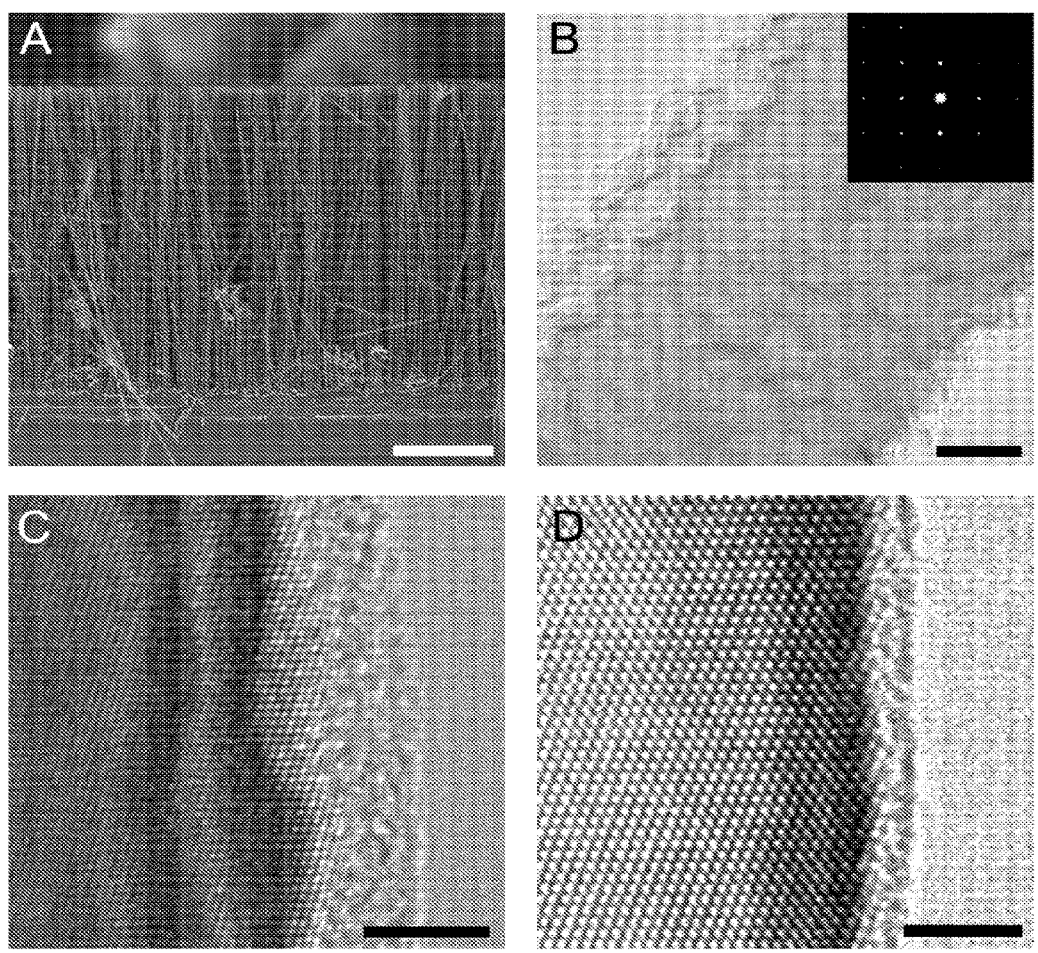
FIG. 1 shows the structural characterization of the rough silicon nanowires. Panel A shows the cross-sectional SEM of an EE Si nanowire array. Dendritic Ag growth can be seen within the array—a product of $Ag^+$ reduction onto the wafer during reaction. The Ag is etched in nitric acid following the synthesis and elemental analysis confirms it is dissolved completely. Panel B shows the bright field TEM image of a segment of an EE Si nanowire. The roughness is clearly seen at the surface of the wire. The SAED pattern (inset) indicates that the wire is single crystalline all along its length. Panel C shows the HRTEM image of an EE Si nanowire. The roughness is evident at the interface between the crystalline Si core and the amorphous native oxide at the surface, and by undulations of the alternating light/dark thickness fringes near the edge. Panel D shows the HRTEM of a VLS-grown Si nanowire. Scale bars are 10 μm, 20 nm, 4 nm, and 3 nm, respectively.

Before the present invention is described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a nanowire" includes a plurality of such nanowires, and so forth.

These and other objects, advantages, and features of the invention will become apparent to those persons skilled in the art upon reading the details of the invention as more fully described below.

The Nanostructure

The nanostructure of the present invention comprises a rough surface, wherein the nanostructure comprises any suitable doped or undoped semiconductor; with the provision that the nanostructure is not a silicon nanowire prepared by immersing cleaned p-type (111)-oriented silicon substrates into an aqueous $HF/AgNO_3$ solution for 20 minutes at 50° C., such as the silicon nanowires described in Peng, et al., Synthesis of large-area silicon nanowire arrays via self-assembling nanochemistry. *Adv. Mater.* 14, 1164-1167 (2002); Peng, et al., Dendrite-assisted growth of silicon nanowires in electroless metal deposition. *Adv. Funct. Mater.* 13, 127-132 (2003); and Peng, et al. Uniform, axial-orientation alignment of one-dimensional single-crystal silicon nanostructure arrays. *Angew. Chem. Int. Edit.* 44, 2737 (2005). The nanostructure of the present invention comprises the following characteristics: confinement and surface engineering (or interface engineering).

The invention also provides for a device comprising a nanostructure comprising a rough surface, wherein the nanostructure comprises a doped or undoped semiconductor and the nanostructure contacts a first electrode and a second electrode. In some embodiments, the device comprises one or more nanostructures, wherein each nanostructure contacts a first electrode and a second electrode.

The nanostructure is one-dimensional (1-D), or two-dimensional (2-D).

The definition of "confinement" is that the nanostructure is one-dimensional (1-D) or two-dimensional (2-D), and has at least one dimension that is limited from 1 nm to 1,000 nm in length. The 1-D nanostructures include, but are not limited to, nanowires. The 2-D nanostructures include, but are not limited to, planar structures. For example, for a 1-D nanostructure the diameter or thickness of a nanowire is from 1 nm to 1,000 nm in length. For example, for a 2-D nanostructure the thickness of the planar structure is from 1 nm to 1,000 nm in length.

The definition of "surface engineering" is that part or all of at least one or more surfaces of the nanostructure is rough, has defects, and/or of a certain chemistry.

In some embodiments of the invention, the surface of a nanostructure is rough in that distance from the highest point to the lowest point relative to the surface is from more than 0 to 5 nm.

In some embodiments of the invention, the surface of a nanostructure is "rough" when the ratio (hereafter the "r ratio") of the actual surface area of the surface compared to the surface area of the surface if the surface was smooth is more than 1. In some embodiments, the r ratio is 2 or more, 3 or more, 4 or more, 5 or more, 10 or more, 20 or more, or 50 or more. The object of having the "rough" surface is to sufficiently scatter phonons in order to reduce k at lower temperatures, such as at room temperature or between about 20° C. to about 30° C. The surface can be "rough" as a result from the manufacturing process caused by the randomness of the lateral oxidation and/or etching by a corrosive aqueous solution or slow HF etching and/or faceting during the synthesis of the nanostructure.

In some embodiments of the invention, the surface of a nanostructure is "rough" when the roughness factor of the surface is more than 1.0. The roughness factor is defined as the ratio of the real surface area the nanostructure over that of a nanostructure with an atomically smooth surface. In some embodiments of the invention, the roughness factor of a nanostructure is at least equal to or more than 1.1, 1.2, 1.3, 1.4, 1.5, 1.6, 1.7, 1.8, 1.9, or 2.0. In other embodiments, the roughness factor of a nanostructure is at least equal to or more than 2.5, 3.0, 5.0, 7.0, or 10.0. In some embodiments, the roughness factor of a nanostructure is at least equal to or more than the roughness factor of one of the nanowires described in Example 1 and 2.

The nanostructure and the dopant materials can be selected from Groups II, III, IV, V, VI, or the like, and can include quaternaries and tertiaries, as well as oxides. In some embodiments, the semiconductor comprises one or more doped type II-VI semiconductor, type III-V semiconductor, type-II-IV semiconductor, and the like. In some embodiments, the semiconductor comprises one or more doped type II-VI semiconductor, type III-V semiconductor, type-II-IV semiconductor, and the like, and can optionally include quaternaries and tertiaries, as well as oxides. In some embodiments, the nanostructure comprises the elements Si, Ge, GaAs, CdSe, GaN, AlN, $Bi_2Te_3$, ZnO, and the like, or a combination thereof, and optionally doped with a valence-five element (for n-type doping) or a valence-three element (for p-type doping). In some embodiments, the nanostructure comprises the elements Si, Ge, or a combination thereof, and optionally doped with a valence-five element (for n-type doping) or a valence-three element (for p-type doping). Suitable dopants include B, Ph, As, In, Al, and the like. Suitable valence-five elements include P, As, Sb, or the like. Suitable valence-three elements include B, Al, Ga, or the like. In some embodiments, the dopant can replace between more than 0% to 100% of Si or Ge, or Si—Ge alloy, of the nanostructure. The nanostructure can be crystalline.

In some embodiments of the invention, each nanostructure is uniform in its composition, for example, any dopant is essentially uniformly distributed throughout the nanostructure, and/or the nanostructure does not comprise a p-type dopant in one end and an n-type dopant in the other end.

In some embodiments of the invention, the nanostructure comprises a 1-D nanostructure, such as a nanowire, comprising an elongated shape with a first end and a second end, and a rough surface, wherein the 1-D nanostructure comprises the elements Si, Ge, or a combination thereof, and optionally doped with a valence-five element or a valence-three element.

In some embodiments, the 1-D nanostructure has a substantially uniform diameter. In certain embodiments, the substantially uniform diameter is less than about 200 nm. In certain embodiments, the plurality of nanostructures is of a population of 1-D nanostructures having substantially monodisperse distribution of diameters and/or lengths. The term "diameter" refers to the effective diameter, as defined by the average of the major and minor axis of the cross-section of the structure.

In some embodiments, the 1-D nanostructure has a diameter of less than approximately 200 nm at its maximum point, and the diameter along the longitudinal axis preferably varies by less than approximately 10% over the section exhibiting the maximum change in diameter. Additionally, the 1-D nanostructures can have various cross-sectional shapes, including, but not limited, to circular, square, rectangular and hexagonal. For example, ZnO 1-D nanostructures have a hexagonal cross-section, $SnO_2$ 1-D nanostructures have a rectangular cross-section, PbSe 1-D nanostructures have a square cross-section, and Si or Ge 1-D nanostructures have a circular cross-section.

The diameter of the 1-D nanostructure is typically less than approximately 200 nm at the maximum point of diameter and preferably in the range from approximately 5 nm to approximately 50 nm. In addition, the variation in diameter across an ensemble of wires synthesized in the same process is relatively sharp, such that the distribution of diameters is typically less than about 50%, less than about 20%, or less than about 10%. Where the cross-section of the nanowire is not circular, the term "diameter" in this context refers to the average of the lengths of the major and minor axis of the cross-section of the 1-D nanostructure, with the plane being normal to the longitudinal axis of the 1-D nanostructure.

In some embodiments, the 1-D nanostructure typically exhibits a high uniformity in diameter from end to end. In certain embodiments, over a section of the 1-D nanostructure the maximum change in diameter would not exceed about 10%, about 5%, or about 1%. The change in diameter may be considered to be given by $(d_{max}-d_{min})/d_{min}$. It should be recognized by one of ordinary skill in the art that the ends of the 1-D nanostructure will contain a sharp change in diameter, possibly even exhibiting an infinite slope, wherein the measure described above is considered to be at a location away from the ends of the 1-D nanostructure. The measurement preferably being made at a location separated from an end by at least 5%, or at least 10%, of the total length of the 1-D nanostructure. In certain embodiments, the change in diameter is evaluated over a length of the 1-D nanostructure that ranges from about 1%, up to about 25%, up to about 75%, or up to about 90% of the total length of the 1-D nanostructure.

The 1-D nanostructure, such as a nanowire, can comprise a cylindrical shape with a rough surface along the shaft of the cylindrical shape. The diameter of the cylindrical shape can be about 5 nm or more, about 10 nm or more, about 20 nm or more, about 50 nm or more, or about 75 nm or more. The diameter of the cylindrical shape can be no more than about 100 nm, no more than about 200 nm, or no more than about 300 nm. In a plurality of 1-D nanostructures, there can be a plurality of the diameters of the 1-D nanostructures varying from about 5 nm or more to no more than about 300 nm. In some embodiments of the invention, in the plurality of 1-D nanostructures, there can be a plurality of the diameters of the 1-D nanostructures varying from about 10 nm or more, or about 20 nm or more, to no more than about 300 nm.

In some embodiments, the nanostructures of the invention have a k of about $2.0 \text{ W} \cdot \text{m}^{-1} \cdot \text{K}^{-1}$ or less, and/or a ZT of about 0.1 or more; at about room temperature or 25° C. In certain embodiments, the nanostructures of the invention have a k of about $1.0 \text{ W} \cdot \text{m}^{-1} \cdot \text{K}^{-1}$ or less, and/or a ZT of about 0.8 or more; at about room temperature or 25° C. In other embodiments, the nanostructures of the invention have a k of about $0.5 \text{ W} \cdot \text{m}^{-1} \cdot \text{K}^{-1}$ or less, and/or a ZT of about 3 or more; at about room temperature or 25° C.

The invention provides for the synthesis of large-area arrays of nanostructures that have a k≤about $1.0 \text{ W} \cdot \text{m}^{-1} \cdot \text{K}^{-1}$ and exhibit a ZT≥about 0.8. By incorporating phonon-scattering interfaces at various length scales, it is possible to impede thermal transport and improve ZT. In some embodiments, the k is reduced 100-fold in nanostructures of the present invention as compared to bulk at room temperature. Roughness at the nanostructure surfaces efficiently scatters phonons and reduces k even further at lower temperatures.

In one embodiment, the nanostructure is a Si nanowire. The invention provides for the synthesis of large-area arrays of rough Si nanowires that have a k of $1.0 \text{ W} \cdot \text{m}^{-1} \cdot \text{K}^{-1}$ and exhibit a large ZT=0.8. By incorporating phonon-scattering interfaces at various length scales, it is possible to impede thermal transport and improve ZT. In this case, the k of Si is reduced 100-fold in nanowires as compared to bulk at room temperature. Roughness at the nanowire surfaces efficiently scatters phonons and reduces k even further at lower temperatures. Although bulk Si is a poor thermoelectric material, by significantly reducing k without affecting other parameters, Si nanowire arrays show promise as high-performance and inexpensive thermoelectric materials for everyday applications.

In some embodiments of the invention, a plurality of the nanostructures are grouped together, such as in an array. In some arrays, all of the nanostructures are arranged parallel to each other.

Synthesis of the Nanostructure

The 1-D nanostructures and a plurality of 1-D nanostructures can be synthesized in any suitable method. Such methods include the methods described in Example 1 and 2 described herein, Peng et al., Synthesis of large-area silicon nanowire arrays via self-assembling nanochemistry, *Adv. Mater.*, 14(16): 1164-1167 (2002), and Peng et al., Aligned single-crystalline Si nanowire arrays for photovoltaic applications, small, 1(11): 1062-1067 (2005), which are hereby incorporated by reference in their entireties.

A plurality of nanowire, such as in an array, can be synthesized by an aqueous electroless etching (EE) method (Peng, K. Q., Yan, Y. J., Gao, S. P. & Zhu, J. Synthesis of large-area silicon nanowire arrays via self-assembling nanochemistry. *Adv. Mater.* 14, 1164-1167 (2002); Peng, K., Yan, Y., Gao, S. & Zhu, J. Dendrite-assisted growth of silicon nanowires in electroless metal deposition. *Adv. Funct. Mater.* 13, 127-132 (2003); Peng, K. et al. Uniform, axial-orientation alignment of one-dimensional single-crystal silicon nanostructure arrays. *Angew. Chem. Int. Edit.* 44, 2737 (2005), which are hereby incorporated by reference in their entireties). A wafer of a Si, Ge or combination thereof, is treated as follows: first is the galvanic displacement of the Si or Ge, or Si—Ge alloy, by $Ag^+/Ag^0$ reduction on the wafer surface. The reaction proceeds in an aqueous solution of $AgNO_3$ and HF. The $Ag^+$ reduces onto the Si, Ge or Si-Ge wafer surface by injecting holes into the Si, Ge or Si-Ge valence band and oxidizing the surrounding lattice, which is subsequently etched by HF. The initial reduction of $Ag^+$ forms Ag nanoparticles on the wafer surface, thus delimiting the spatial extent of the oxidation and etching process. Further reduction of $Ag^+$ occurs on the nanoparticles, not the Si, Ge or Si-Ge wafer, which becomes the active cathode by electron transfer from the underlying wafer. The 2-D nanostructures and a plurality of 2-D nanostructures of the present invention can be synthesized in any suitable method. Such methods include using Langmuir-Blodgett (LB) process, for example, described in "Langmuir-Blodgett silver nanowire monolayers for molecular sensing with high sensitivity and specificity", A. Tao, F. Kim, C. Hess, J. Goldberger, R. He, Y. Sun, Y. Xia, P. Yang, *Nano. Lett.* 3, 1229, 2003 (which is hereby incorporated in its entirety by reference). For example, the LB process can readily produce a monolayer or multi-layer of monodispersed nanocrystals. Such monolayers and multilayers can then be fused together to generate rough 2-D nanostructures.

Another suitable process of synthesizing 2-D nanostructures of the present invention comprises: (a) providing a physical or chemical vapor deposition (such as, atomic layer deposition or molecular beam epitaxy) to make a thin film with smooth surface, (b) dispersing one or more nanocrystals on the surface of the thin film, and (c) fusing the one or more nanocrystals to the thin films.

Devices Comprising the Nanostructure

The present invention provides for a device comprising a nanostructure, including the nanowires described in Peng, et al., Synthesis of large-area silicon nanowire arrays via self-assembling nanochemistry. *Adv. Mater.* 14, 1164-1167 (2002); Peng, et al., Dendrite-assisted growth of silicon nanowires in electroless metal deposition. *Adv. Funct. Mater.* 13, 127-132 (2003); and Peng, et al. Uniform, axial-orientation alignment of one-dimensional single-crystal silicon nanostructure arrays. *Angew. Chem. Int. Edit.* 44, 2737 (2005), contacting a first electrode and a second electrode. When the device is in operation, the first electrode and the second electrode are in electrical communication.

In some embodiments of the invention, the device comprises one or more 1-D nanostructures, such as nanowires, of the present invention, wherein the first end contacts a first electrode and the second end contacts a second electrode.

In some embodiments of the invention, the method of creating an electric current comprises: providing a device of the present invention, and setting up a temperature gradient between the first and second electrodes, such that an electric current is created that flows from the first electrode to the 1-D nanostructure, such as a nanowire, and through the 1-D nanostructure to the second electrode.

In some embodiments of the invention, the device comprises: a first electrode; a second electrode; a third electrode; a first plurality of 1-D nanostructures, such as nanowires, each comprising an elongated shape with a first end and a second end, and a rough surface, wherein the 1-D nanostructures comprise Si, Ge, or a combination thereof, doped with a valence-three element (such that the 1-D nanostructures comprise a p-type semiconductor); and, a second plurality of 1-D nanostructures, such as nanowires, each comprising an elongated shape with a first end and a second end, and a rough surface, wherein the 1-D nanostructures comprise Si, Ge, or a combination thereof, doped with a valence-five element (such that the 1-D nanostructures comprise a n-type semiconductor); wherein the first end of the first plurality of 1-D nanostructures contacts the first electrode, the second end of the first plurality of 1-D nanostructures contacts the third electrode, the first end of the second plurality of 1-D nanostructures contacts the first electrode, the second end of the second plurality of 1-D nanostructures contacts the second electrode; such that when the first electrode has a higher temperature than the second and third electrodes an electric current is created that flows from the second electrode to the second plurality of 1-D nanostructures, through the second plurality of 1-D nanostructures to the first electrode, through first electrode to the first plurality of 1-D nanostructures, through the first plurality of 1-D nanostructures to the third electrode.

In some embodiments of the invention, the method of creating an electric current comprises: providing the device of the present invention having a first plurality of 1-D nanostructures, such as nanowires, and a second plurality of 1-D nanostructures, such as nanowires, and increasing the temperature of the first electrode; such that an electric current is created that flows from the second electrode to the second plurality of 1-D nanostructures, through the second plurality of 1-D nanostructures to the first electrode, through first electrode to the first plurality of 1-D nanostructures, through the first plurality of 1-D nanostructures to the third electrode.

In some embodiments of the invention, the method of decreasing the temperature of a locality comprises: providing a device of the present invention, and applying an electric current through the device; such that the temperature of the first electrodes is decreased, wherein the first electrode is at or near the locality, and the temperature of the second and third electrodes is increased.

In some embodiments, the device is such that the first electrode comprises a first opaque material and the second electrode comprises a second opaque material, wherein the first and second opaque materials are the same or different material. In some embodiments, the electrodes are not transparent, such as, an electrode comprising essentially of In-doped $SnO_2$ or Al-doped ZnO. In some embodiments, during the operation of the device, no or essentially no light or photons contact the nanostructure, such as nanowires, of the device, or there is no requirement for light or photons to contact the nanostructure, such as nanowires, of the device in order for the device to operate in its intended manner.

In some embodiments, the device is such that the first electrode and the second electrode are in electrical communication. Specifically, when the device is in operation, the first electrode and the second electrode are in electrical communication.

In some embodiments, the device is such that when there is a difference in temperature between the first electrode and the second electrode such that an electric current is created through the nanostructure.

In some embodiments of the invention, the device comprises a plurality of nanostructures, wherein the first end of each nanostructure contacts a first electrode and the second end of each nanostructure contacts a second electrode. When the temperature of the first electrode is increased relative to the temperature of the second electrode, or the temperature of the second electrode is decreased relative to the temperature of the first electrode, an electric current is created in which there is an electric current flowing from the first electrode to the nanostructure, and through the nanostructure to the second electrode. In some embodiments of the invention, the method of using the device described above further comprises maintaining a temperature difference (or temperature gradient) between the first and second electrodes, such the electrode with the higher temperature continues to have a higher temperature. When the device is in operation, the first electrode and the second electrode are in electrical communication.

In some embodiments of the invention, when the nanostructure is a nanowire, the device comprises a plurality of nanowires (30), wherein the first end of each nanowire (31) contacts a first electrode (10) and the second end of each nanowire (32) contacts a second electrode (20). When the temperature of the first electrode (10) is increased relative to the temperature of the second electrode (20), or the temperature of the second electrode (20) is decreased relative to the temperature of the first electrode (10), an electric current is created in which there is an electric current (60) flowing from the first electrode (10) to the nanowire (30), and through the nanowire (30) to the second electrode (20). (See FIG. 6.) When the device is in operation, the first electrode (10) and the second electrode (20) are in electrical communication.

Figure 6:
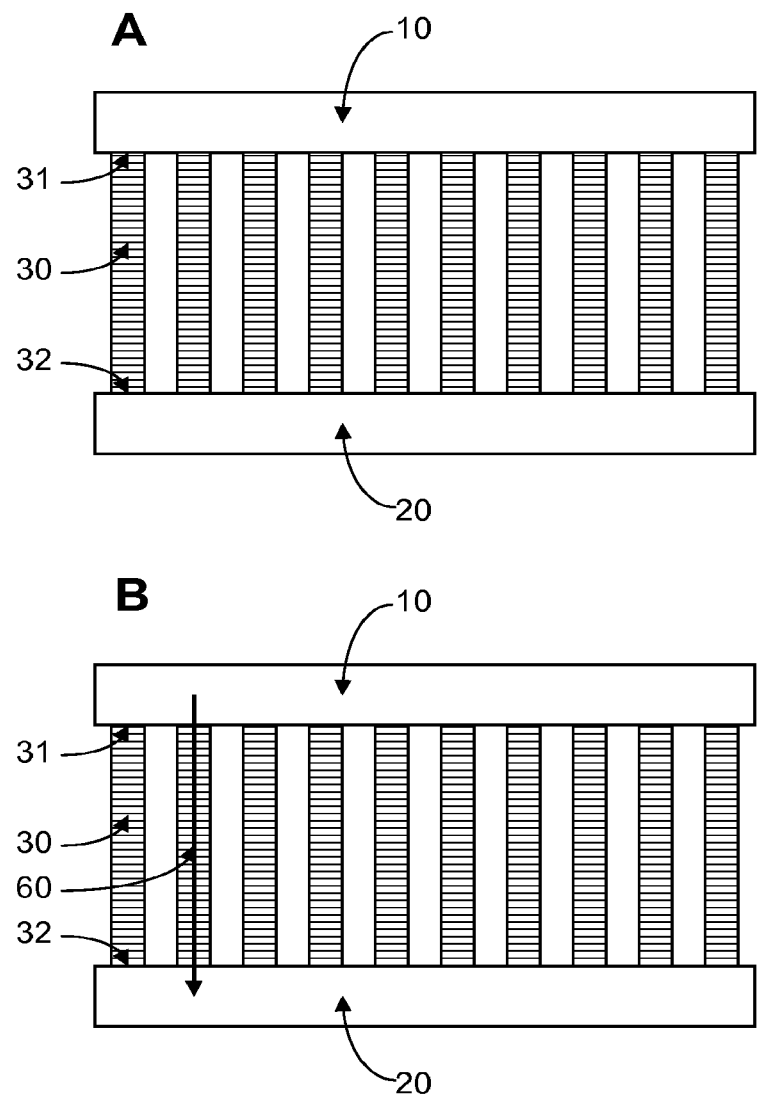
FIG. 6 shows a device comprising the nanowire useful for creating an electric current. The first plurality of nanowires are shown by the hatched rectangles. The second plurality of nanowires are shown by the dot-filled rectangles. Panel A shows the parts of the device. Panel B shows the electric current created by the use of the device.

In some embodiments of the invention, the method of using the device depicted in FIG. 6 further comprises maintaining a temperature difference (or temperature gradient) between the first and second electrodes, such the electrode with the higher temperature continues to have a higher temperature.

In some embodiments of the invention, when the nanostructure is a nanowire, the device comprises a first electrode (10); a second electrode (90); a third electrode (100); a first plurality of nanowires (40) each comprising an elongated shape with a first end (41) and a second end (42), and a rough surface, wherein each nanowire comprises Si, Ge, or a combination thereof, doped with a valence-five element; and, a second plurality of nanowires (50) each comprising an elongated shape with a first end (51) and a second end (52), and a rough surface, wherein each nanowire comprises Si, Ge, or a combination thereof, doped with a valence-three element; wherein the first end (41) of the first plurality of nanowires (40) contacts the first electrode (10), the second end (42) of the first plurality of nanowires (40) contacts the third electrode (100), the first end (51) of the second plurality of nanowires (50) contacts the first electrode (10), the second end (52) of the second plurality of nanowires (50) contacts the second electrode (90). When the temperature of the first electrode (10) is increased relative to the temperature of the second electrode (90) and third electrode (100), or the temperature of the second electrode (90) and third electrode (100) is decreased relative to the temperature of the first electrode (10), an electric current is created in which the electric current (70) flows from the second electrode (90) through the second plurality of nanowires (50) to the first electrode (10), the electric current flows (80) from the location where the first end (51) of the second plurality of nanowires (50) contacts the first electrode (10) to the location where the first end (41) of the first plurality of nanowires (40) contacts the first electrode (10), and the electric current flows (85) from the first electrode (10) through the first plurality of nanowires (40) to the third electrode (100). (See FIG. 7.) When the device is in operation, the second electrode (90) and the third electrode (100) are in electrical communication.

Figure 7:
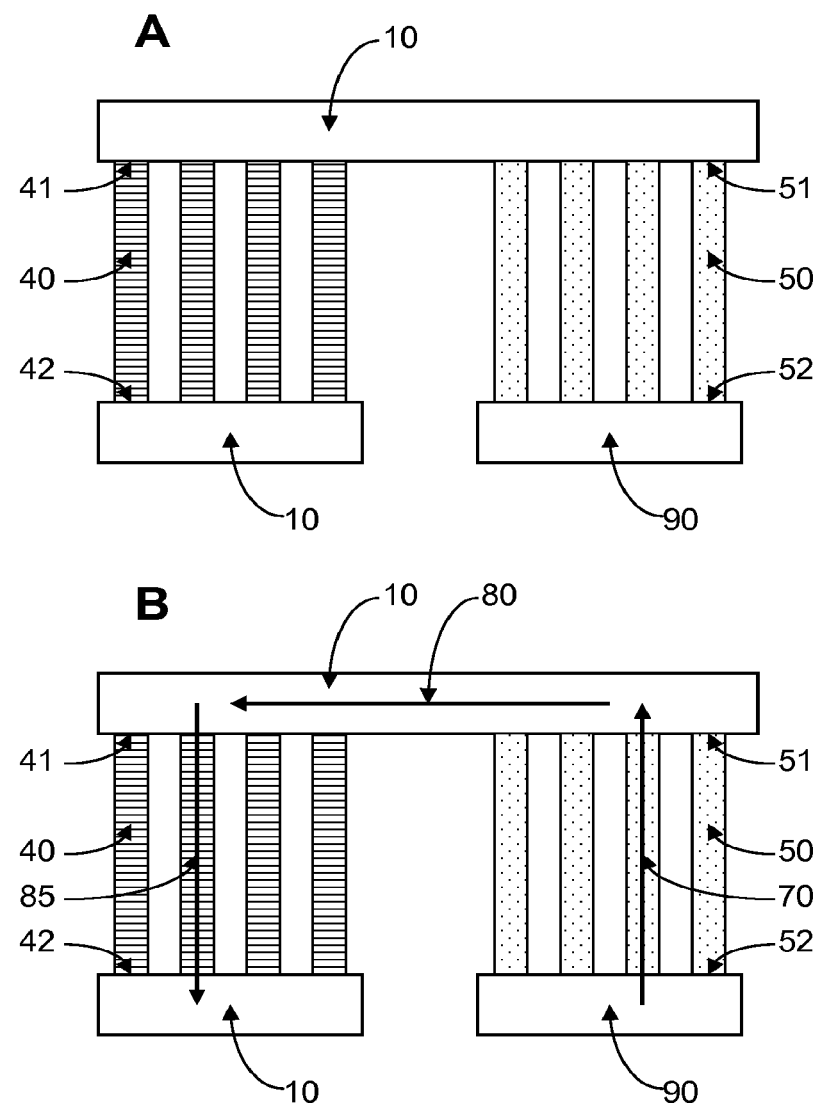
FIG. 7 shows a device comprising two pluralities of the nanowire useful for creating an electric current. Panel A shows the parts of the device. Panel B shows the electric current created by the use of the device. The first plurality of nanowires (40) has p-type doping. The second plurality of nanowires (50) has n-type doping.

In some embodiments of the invention, the method of using the device depicted in FIG. 7 further comprises maintaining a temperature difference (or temperature gradient) between (a) the first electrode and (b) the second and third electrodes.

The electrodes can comprise any suitable material, such as, Pt, Au, Ti, or the like.

The difference in temperature between the first and second electrodes is 1 degree or more, 5 degrees or more, 10 degrees or more, 50 degrees or more, 100 degrees or more, or 200 degrees or more. Any temperature is suitable as long as the temperature of each electrode does not result in the melting of any component of the device, or the interference of the desired electric current.

The electric current can be passed through or captured or stored by a capacitor, or the electric current can be used to drive any electrically driven machine that uses a direct current, such as a motor.

Figure 8:
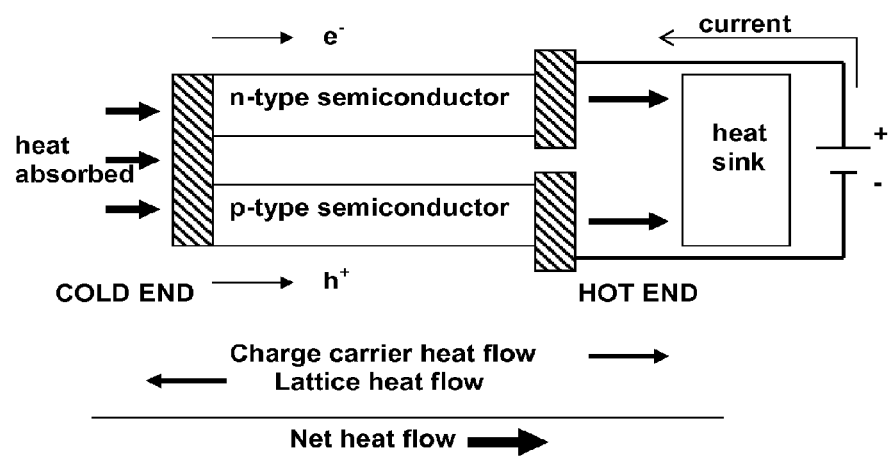
FIG. 8 shows a thermoelectric cooler incorporating a device of the present invention as shown in FIG. 7. The hatched boxes indicate the electrodes contacting the nanostructures.
Figure 9:
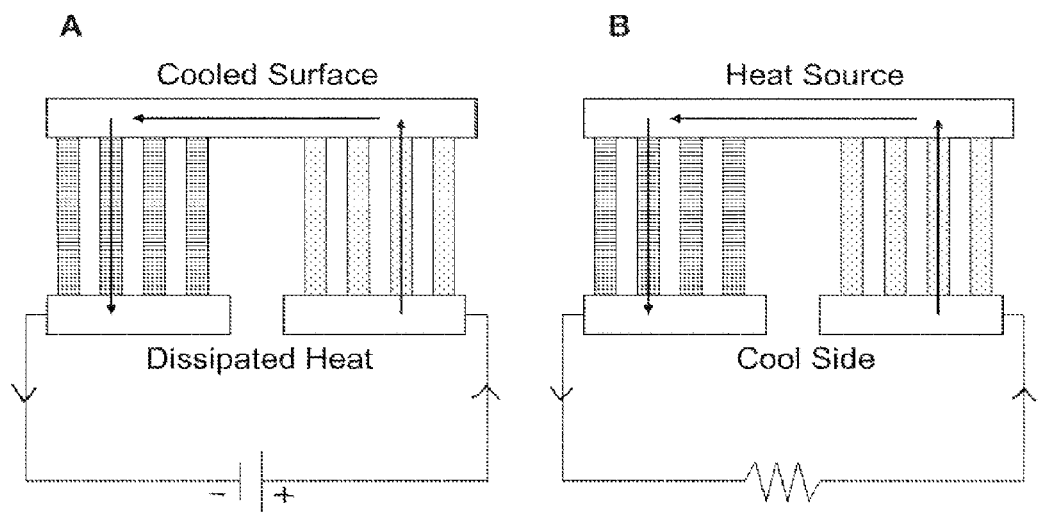
FIG. 9 shows a thermoelectric cooler (Panel A) and a thermoelectric power generator (Panel B) incorporating a device of the present invention as shown in FIG. 7. The arrows indicate the direction of flow of the electric current.

The device of the invention can be a thermoelectric power generator or thermoelectric cooler (see FIGS. 8 and 9). The device of the invention can be used for thermoelectric power generation or thermoelectric cooling, such as for computer chip cooling.

Any of the devices described above, including but not limited to the devices depicted in FIGS. 6-9, can be arranged in series and/or in array.

The invention having been described, the following examples are offered to illustrate the subject invention by way of illustration, not by way of limitation.

Example 1

Rough Silicon Nanowire

The most widely used commercial thermoelectric material is bulk $Bi_2Te_3$ and its alloys with Sb, Se, etc, which have ZT~1. While it is difficult to scale bulk $Bi_2Te_3$ to large-scale energy conversion, fabricating synthetic nanostructures for this purpose is even more difficult and expensive. Si, on the other hand, is the most abundant and widely used semiconductor with a large industrial infrastructure for low-cost and high-yield processing. Bulk Si, however, has a high k (~150 $W \cdot m^{-1} \cdot K^{-1}$ at room temperature) (Touloukian, Y. S., Powell, R. W., Ho, C. Y. & Klemens, P. G. *Thermal Conductivity: Metallic Elements and Alloys, Thermophysical Properties of Matter*, v. 1, IFI/Plenum, New York, 339 (1970)), making the ZT~0.009 at 300 K (Weber, L. & Gmelin, E. Transport properties of silicon. *Appl. Phys. A* 53, 136-140 (1991), which are hereby incorporated by reference in their entireties). The spectral distribution of phonons contributing to the k of Si at room temperature is quite broad. Because the rate of phonon-phonon Umklapp scattering scales as $\omega^2$, where $\omega$ is the phonon frequency, low frequency (or long-wavelength) acoustic phonons have long mean free paths and contribute significantly to k at high temperatures (Nolas, G. S. & Sharp, J., Goldsmid, H. J. *Thermoelectrics: Basic Principles and New Materials Development*, Springer-Verlag, Berlin, 2001; Asheghi, M., Leung, Y. K., Wong, S. S. & Goodson, K. E. Phonon-boundary scattering in thin silicon layers. *Appl. Phys. Lett.* 71, 1798-1800 (1997); Asheghi, M., Touzelbaev, Goodson, K. E., Leung, Y. K. & Wong, S. S. Temperature-dependent thermal conductivity of single-crystal silicon layers in SOI substrates. *J. Heat Transf* 120, 30-36 (1998); Ju, Y. S. & Goodson, K. E. Phonon scattering in silicon films with thickness of order 100 nm. *Appl. Phys. Lett.* 74, 3005-3007 (1999), which are hereby incorporated by reference in their entireties). Thus, by rational incorporation of phonon-scattering elements at several length scales, the k of Si is expected to decrease dramatically. Here, we show that by using roughened nanowires, one can reduce the thermal conductivity to ~1 $W \cdot m^{-1} \cdot K^{-1}$ without significantly modifying $S^2\sigma$, such that ZT~1 at room temperature. Further reduction of nanowire diameter is likely to increase ZT>1, offering the possibility of high-performance, low-cost and scalable Si-based thermoelectric devices.

Wafer-scale arrays of Si nanowires were synthesized by an aqueous electroless etching (EE) method (Peng, K. Q., Yan, Y. J., Gao, S. P. & Zhu, J. Synthesis of large-area silicon nanowire arrays via self-assembling nanochemistry. *Adv. Mater.* 14, 1164-1167 (2002); Peng, K., Yan, Y., Gao, S. & Zhu, J. Dendrite-assisted growth of silicon nanowires in electroless metal deposition. *Adv. Funct. Mater.* 13, 127-132 (2003); Peng, K. et al. Uniform, axial-orientation alignment of one-dimensional single-crystal silicon nanostructure arrays. *Angew. Chem. Int. Edit.* 44, 2737 (2005), which are hereby incorporated by reference in their entireties). The technique is based on the galvanic displacement of Si by $Ag^+/Ag^0$ reduction on the wafer surface. The reaction proceeds in an aqueous solution of $AgNO_3$ and HF. Briefly, $Ag^+$ reduces onto the Si wafer surface by injecting holes into the Si valence band and oxidizing the surrounding lattice, which is subsequently etched by HF. The initial reduction of $Ag^+$ forms Ag nanoparticles on the wafer surface, thus delimiting the spatial extent of the oxidation and etching process. Further reduction of $Ag^+$ occurs on the nanoparticles, not the Si wafer, which becomes the active cathode by electron transfer from the underlying wafer.

Nanowires synthesized by this approach were vertically aligned and consistent throughout batches up to the wafer scale. FIG. 1, Panel A shows a cross-sectional scanning electron microscope (SEM) image of one such array. Key parameters of the reaction were identified using p-type (100) oriented, nominally 10-20 $\Omega \cdot cm$ Si as the etch wafer. Both etching time and $AgNO_3$ concentration controlled nanowire length, roughly linearly, down to 5 µm at short immersion times (<10 minutes). At longer etching times, nanowire lengths were controllable up to 150 µm, while longer wires were too fragile to preserve the array. Wafers cut to (100), (110), and (111) orientations all yielded nanowire arrays etched normal to the wafer surface over most of the wafer area. Similar results were obtained for electroless etching of both n- and p-type wafers with resistivities varying from 0.01 to 10 $\Omega \cdot cm$. Since thermoelectric modules consist of complementary p- and n-type materials wired in series, the generality and scalability of this synthesis indicate it is a promising method for fabrication of Si-based devices.

After etching, the fill factor of the nanowires was approximately 30 percent over the entire wafer surface. The nanowires varied from 20 to 300 nm in diameter with an average diameter of approximately 100 nm, as measured from transmission electron microscope (TEM) micrographs (FIG. 1, Panel B). The nanowires were single crystalline, as evidenced by the selected area electron diffraction (SAED) pattern (top inset) and high-resolution TEM (HRTEM) image of the Si lattice of the nanowire in FIG. 1, Panel C. In contrast to the smooth surface of typical vapor-liquid-solid (VLS) grown, gold catalyzed Si nanowires (FIG. 1, Panel D) (Li, D. et al. Thermal conductivity of individual silicon nanowires. *Appl. Phys. Lett.* 83, 2934-2936 (2003); Hochbaum, A. I., Fan, R., He, R. & Yang, P. Controlled growth of Si nanowire arrays for device integration. *Nano Lett.* 5, 457-460 (2005)), which are hereby incorporated by reference in their entireties, those of the EE Si nanowires are much rougher. The mean roughness height of these nanowires varied wire to wire, but was typically 1 to 5 nm with a roughness period on the order of several nanometers. This roughness may be attributed to randomness of the lateral oxidation and etching in the corrosive aqueous solution or slow HF etching and faceting of the lattice during synthesis.

Figure 2:
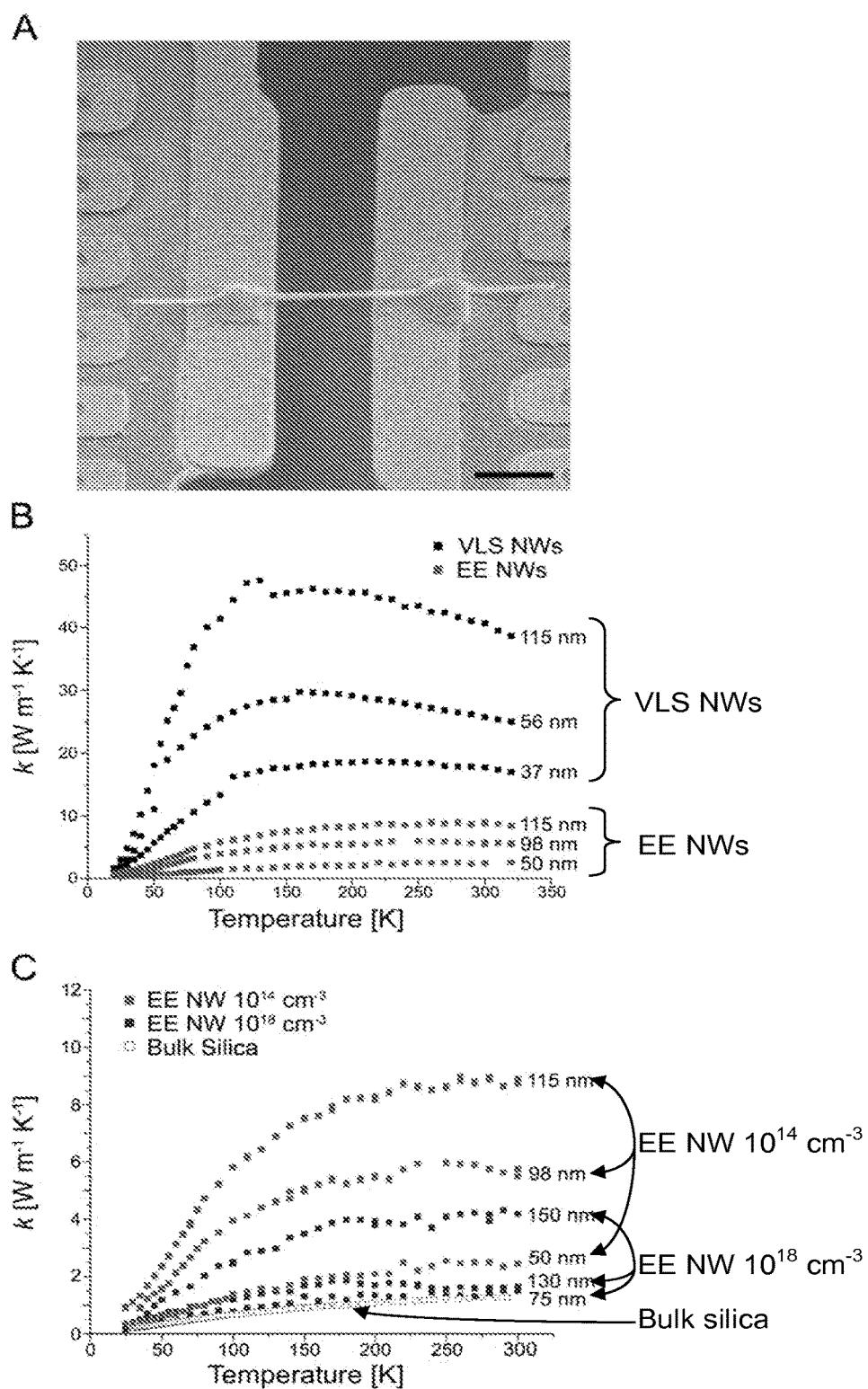
FIG. 2 shows the thermal conductivity of the rough silicon nanowires. Panel A shows a SEM image of a Pt-bonded EE Si nanowire (taken at 52° tilt angle). The Pt thin film loops near both ends of the bridging wire are part of the resistive heating and sensing coils on opposite suspended membranes. Scale bar is 2 μm. Panel B shows the temperature-dependent k of VLS (reproduced from Li, D. et al. Thermal conductivity of individual silicon nanowires. *Appl. Phys. Lett.* 83, 2934-2936 (2003)) and EE nanowires (indicated solid squares). The peak k of the VLS nanowires is around 175-200 K, while that of the EE nanowires is above 250 K. The data in this graph are from EE nanowires synthesized from low-doped wafers. Panel C shows the temperature-dependent k of EE Si nanowires of different dopant densities: $10^{14}$ and $10^{18}$ cm$^{-3}$ (indicated solid squares). For the purpose of comparison, the k of bulk amorphous silica is plotted with open squares. The smaller highly doped EE Si nanowires have a k approaching that of insulating glass, suggesting an extremely short phonon mean free path.

The key advantage of using Si nanowires for thermoelectric applications lies in the large difference in mean free path lengths between electrons and phonons at room temperature: 1-10 nm for electrons in highly doped samples (Ashcroft, N. W. & Mermin, N. D. *Solid State Physics*, Saunders College Publishing, Fort Worth, ch. 1, 2, 13 (1976); Sze, S. M. *Physics of Semiconductor Devices*, John Wiley & Sons, Inc., New York, ch. 1 (1981), which are hereby incorporated by reference in their entireties) and ~300 nm for phonons at room temperature (Ju, Y. S. & Goodson, K. E. Phonon scattering in silicon films with thickness of order 100 nm. *Appl. Phys. Lett.* 74, 3005-3007 (1999), which is hereby incorporated by reference in its entirety). The mean free path of electrons was calculated by $l_e = v_{th} \cdot \tau$, where $$v_{th} = \sqrt{\frac{3k_B T}{m*}}$$

is the electron thermal velocity and $$\tau = \frac{\mu \cdot m*}{q}$$

is the mean scattering time expressed in terms of the mobility ($\mu$), effective conduction electron mass ($m* = 0.26 \cdot m_0$), and the elementary electron charge (q). For a highly doped n-type Si wafer the mobility was extracted from Hall measurements (see Example 2). $\mu = 265$ cm$^2 \cdot$V$^{-1} \cdot$s$^{-1}$ at room temperature, yielding an electron mean free path of 8.98 nm. More highly doped Si samples will have a shorter mean free path as the mobility decreases due to ionized impurity scattering. Consequently nanostructuring Si below 300 nm should reduce the thermal conductivity without significantly affecting S$^2\sigma$, which is mainly controlled by electron transport. The thermal conductivity of these hierarchically structured Si nanowires was characterized using devices consisting of resistive coils supported on parallel, suspended SiN$_x$ membranes (Li, D. et al. Thermal conductivity of individual silicon nanowires. *Appl. Phys. Lett.* 83, 2934-2936 (2003); Shi, L. et al. Measuring thermal and thermoelectric properties of one-dimensional nanostructures using a microfabricated device. *J. Heat Transf.* 125, 881-888 (2003), which are hereby incorporated by reference in their entireties). To anchor the nanowire to the membranes and reduce contact resistance, a Pt-C composite was deposited on both ends using a focused ion beam (FIG. 2, Panel A). The membranes are thermally connected through a bridging nanowire, with negligible leakage from heat transfer by means other than conduction through the wire. The thermal conductivity was extracted from the thermal conductance using the dimension of the nanowire, as determined by SEM.

FIG. 2, Panel B shows the measured thermal conductivity of both VLS and EE Si nanowires. It was previously known that the k of VLS Si nanowires is strongly diameter dependent (14), which is attributed to boundary scattering of phonons. We found that EE Si nanowires exhibit a diameter dependence of k similar to that of VLS-grown wires. What is surprising is that the magnitude of k is five- to eight-fold lower for EE nanowires of comparable diameters. Since the phonon spectrum is broad and Planck-like, reduction of k can be achieved by introducing scattering at additional length scales beyond the nanowire diameter (Majumdar, A. Thermoelectricity in semiconductor nanostructures. *Science* 303, 777-778 (2004); Hsu, K. F. et al. Cubic AgPb$_m$SbTe$_{2+m}$: bulk thermoelectric materials with high figure of merit. *Science* 303, 818-821 (2004); Harman, T. C., Taylor, P. J., Walsh, M. P. & LaForge, B. E. Quantum dot superlattice thermoelectric materials and devices. *Science* 297, 2229-2232 (2002); Venkatasubramanian, R., Siivola, E., Colpitts, T. & O'Quinn, B. Thin-film thermoelectric devices with high room-temperature figures of merit. *Nature* 413, 597-602 (2001); Kim, W. et al. Thermal conductivity reduction and thermoelectric figure of merit increase by embedding nanoparticles in crystalline semiconductors. *Phys. Rev. Lett.* 96, 045901-1-045901-4 (2006), which are hereby incorporated by reference in their entireties). In the case of the EE nanowires, the roughness at the nanowire surface behaves like secondary phase particles in a crystal by scattering phonons of medium- to long-wavelengths. The roughness may contribute to higher rates of diffuse reflection or backscattering of phonons at the interfaces. These processes have been predicted to affect k of Si nanowires, but not to the extent observed here (Zou, J. & Balandin, A. Phonon heat conduction in a semiconductor Nanowire. *J. App. Phys.* 89, 2932-2938 (2001); Saha, S., Shi, L. & Prasher, R. Monte Carlo simulation of phonon backscattering in a Nanowire. *Proc. of Int. Mech. Eng. Congress and Exp.* IMECE2006-15668: 1-5 (2006)). The peak k is shifted to a much higher temperature than that of VLS nanowires, and both are significantly higher than that of bulk Si, which peaks around 25 K (Touloukian, Y. S., Powell, R. W., Ho, C. Y. & Klemens, P. G. *Thermal Conductivity: Metallic Elements and Alloys, Thermophysical Properties of Matter*, v. 1, IFI/Plenum, New York, 339 (1970), which are hereby incorporated by reference in their entireties). This shift suggests that the phonon mean free path is limited by boundary scattering as opposed to intrinsic Umklapp scattering.

To further decrease k by introducing a third length scale (point defects), nanowires were etched from highly doped (As) n-type (100) wafers with a carrier concentration of $1 \times 10^{18}$ cm$^{-3}$. Indeed these nanowires show a four-fold decrease in k from low-doped EE Silicon nanowires ($1 \times 10^{14}$ cm$^{-3}$) of similar diameters, as seen in FIG. 2, Panel C. Studies of doped and isotopically purified bulk Si have observed a reduction of k as a result of impurity scattering (Weber, L. & Gmelin, E. Transport properties of silicon. *Appl. Phys. A* 53, 136-140 (1991); Brinson, M. E. & Dunstan, W. Thermal conductivity and thermoelectric power of heavily doped n-type silicon. *J. Phys. C* 3, 483-491 (1970); Ruf, T. et al. Thermal conductivity of isotopically enriched silicon. *Solid State Commun.* 115, 243-247 (2000), which are hereby incorporated by reference in their entireties). Due to the atomic nature of such defects, they are expected to predominantly scatter short-wavelength phonons. In the case of these highly doped nanowires, the k of wires approximately 100 nm in diameter has been reduced to 1.5 W·m$^{-1}$·K$^{-1}$ at room temperature. For comparison, the temperature dependent k of amorphous bulk SiO$_2$ (data points used from http://users.mrl.uiuc.edu/cahill/tcdata/tcdata.html, agree with measurement in Cahill, D. G. & Pohl, R. O. Thermal conductivity of amorphous solids above the plateau. *Phys. Rev. B* 35, 4067-4073 (1987), which is hereby incorporated by reference in its entirety) is also plotted in FIG. 2, Panel B, suggesting that the total k of highly doped single-crystal EE Si nanowires is comparable to that of insulating glass where the phonon mean free paths are on the order of interatomic spacings. Furthermore, the peak ZT for semiconductors is predicted to occur at a dopant concentration of $1\times10^{19}$ cm$^{-3}$, so optimally doped wires would likely have an even lower k (Rowe, D. M. ed. CRC *Handbook of Thermoelectrics*, CRC Press, Boca Raton, ch. 5 (1995), which is hereby incorporated by reference in its entirety).

Figure 3:
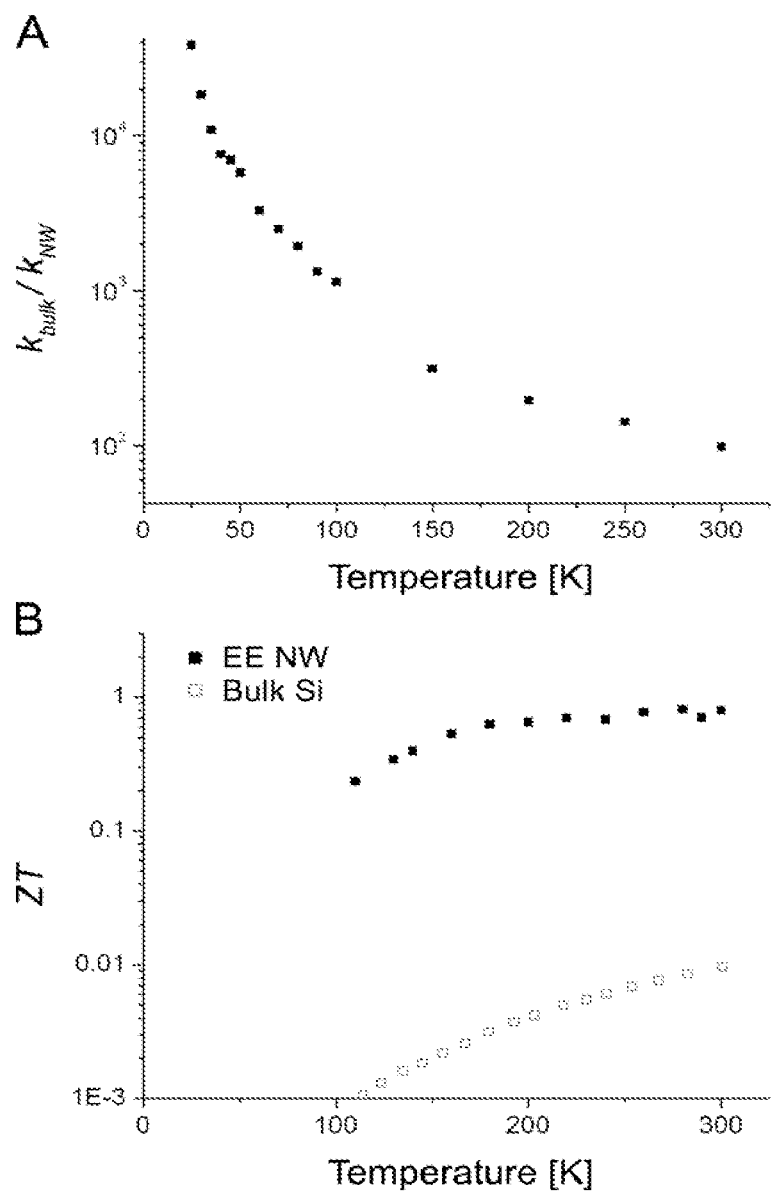
FIG. 3 shows the figure of merit estimation for the rough silicon nanowire. Panel A shows the ratio of bulk k to that of a highly doped EE Si nanowire 75 nm in diameter. $k_{bulk}:k_{NW}$ increases dramatically with decreasing temperature, from 100 at 300 K to almost 40,000 at 25 K. Panel B shows the ZT calculated for the 75 nm highly doped EE nanowire as compared to ZT extracted from degenerately doped bulk Si data in Weber, L. & Gmelin, E. Transport properties of silicon. *Appl. Phys. A* 53, 136-140 (1991).

Another consequence of strong scattering of phonons at the EE Silicon nanowire surface is that as the temperature decreases, the disparity between k of the nanowire and bulk grows. At low temperatures, the long wavelength phonon modes, which contribute strongly to thermal transport in bulk, are efficiently scattered in the roughened nanowires. FIG. 3, Panel A charts the ratio of $k_{bulk}$:$k_{nw}$ for a 75 nm highly doped EE Silicon nanowire as a function of temperature. While the $k_{nw}$ is two orders of magnitude lower than $k_{bulk}$ at room temperature, this ratio reaches more than five orders of magnitude at low temperature. Such a large disparity of k bodes well for significant ZT enhancement.

To calculate the nanowire ZT, resistivity and Seebeck measurements were carried out on the exact wafers from which the nanowires were etched. The EE reaction proceeds near room temperature, so no dopant or impurity diffusion in or out of the wire is expected, i.e. the nanowire should retain the same crystalline structure and defects of the wafer. Additionally, because the nanowires are many times larger than the mean free path of electrons in Si, no significant electron scattering should occur, and the resistivity and Seebeck coefficient should be consistent with that of bulk (see Example 2 for measurements). The ZT for the 75 nm EE Si nanowire is highest near room temperature at 0.8 (FIG. 3, Panel B). Although the Seebeck coefficient of the highly doped Si initially increases slightly with decreasing temperature, the rise is not sufficient to offset the rapid increase of resistivity. Consequently, the ZT decreases monotonically with temperature. As compared to optimally doped bulk Si (~$1\times10^{19}$ cm$^{-3}$), the ZT of the EE nanowire is close to 100 times greater throughout the temperature range measured.

In conclusion, we have shown that it is possible to achieve ZT=0.8 at room temperature in rough Si nanowires of 75 nm diameter that were processed by a wafer scale manufacturing technique. Furthermore, with optimal doping, diameter reduction, and roughness control, the ZT is likely to rise even higher. This ZT enhancement can be attributed to the efficient scattering, throughout the phonon spectrum, by the introduction of nanostructures at different length scales (diameter, roughness, and point defects). By achieving broadband impedance of phonon transport, we have demonstrated that the EE Si nanowire system is capable of approaching the limits of minimum lattice thermal conductivity in crystals. Furthermore, modules with the efficiencies reported here, and manufactured from such an inexpensive and ubiquitous material as Si, would find wide-ranging applications in waste heat salvaging, power generation, and solid-state refrigeration. Moreover, the phonon scattering techniques developed in this study could significantly augment ZT even further in other materials (there is no theoretical limit) and produce highly efficient solid-state devices with the potential to replace mechanical power generation and refrigeration systems.

Example 2

Nanowire Synthesis

The standard nanowire synthesis was conducted on B-doped p-type (100) Si wafers. Wafer chips were sonicated in acetone and 2-propanol, and then put in a Teflon-lined autoclave in aqueous solution of 0.02 M AgNO$_3$ and 5 M hydrofluoric acid (HF). The autoclave was sealed and placed in an oven at 50° C. for one hour. For 150 µm-long nanowires, wafer chips were prepared in the same fashion, and placed in the autoclave with 0.04 M AgNO$_3$ and 5 M HF for four hours. Nanowires were also etched from entire Si wafers. Wafers were cleaned and placed in a Teflon dish with an identical etching solution and the synthesis ran at room temperature. The wafers etched in the open dish at room temperature produced wires similar to those etched in the autoclave but <50 µm in length. The same reaction conditions were used on wafers of all orientations, dopant type and concentration. Small regions on all samples had nanowires etched at an angle to normal.

Nanowire Characterization.

Cross-sectional samples were prepared by cleaving the EE Si nanowire substrate and viewing normal to the cleaved surface. SEM images were obtained using a JEOL JSM-6340F field emission SEM and a FEI Strata 235 Dual Beam FIB. TEM and HRTEM images were collected with a Phillips CM200/FEG (field-emission gun) microscope at 200 kV.

Thermal Bonding of Nanowires.

EE Si nanowires were bonded to both suspended SiN$_X$ using a FEI Strata 235 Dual Beam FIB. A focused electron (5 kV, spot size 3) or ion (Ga ions, 30 kV, 10 pA aperture) beam was used to deposit Pt selectively on either end of the bridging nanowire. The incident beams cause secondary electron emission from the underlying material's surface, locally decomposing a metal-organic Pt precursor. Care was taken not to expose the sample to electron or ion irradiation immediately following deposition, but some deposition always occurs within a one to two micron radius of the exposed region.

Figure 4:
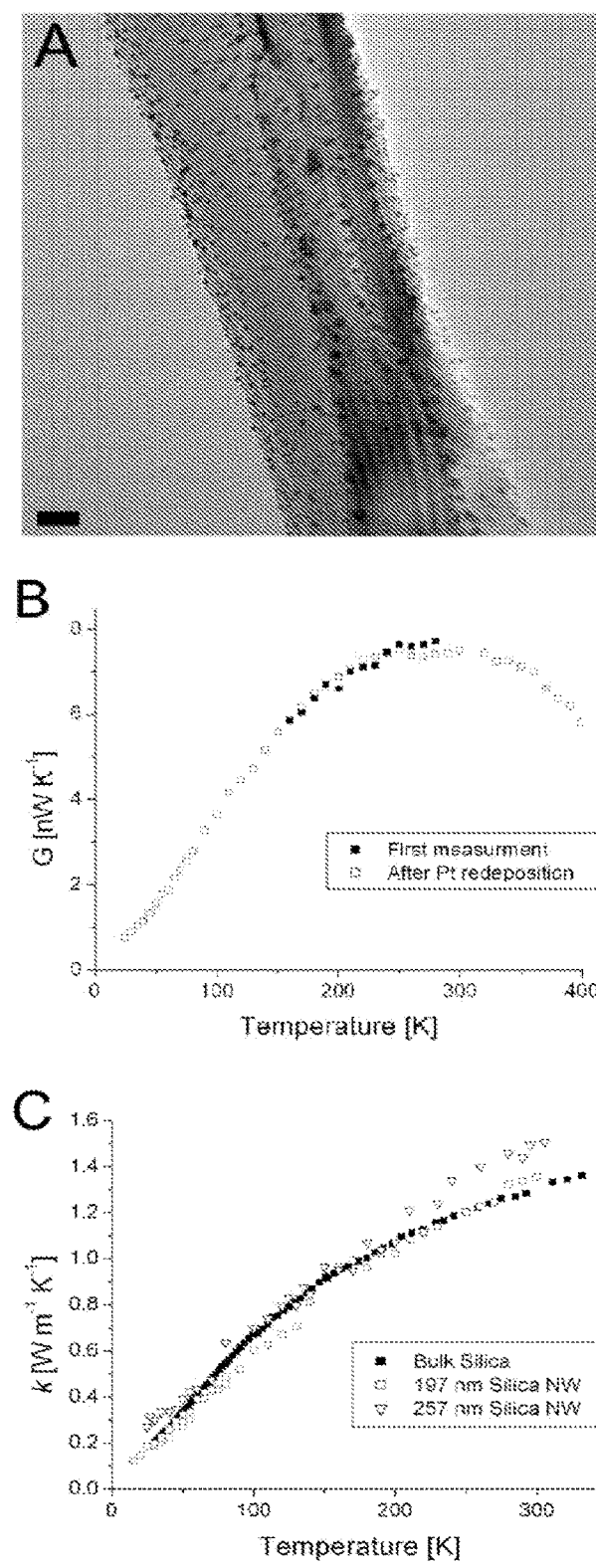
FIG. 4 shows the nanowire FIB bonding and control experiments. Panel A shows the TEM image of Pt-C excess deposition on the nanowire away from the irradiated region. The deposition adds thickness to the diameter of the wire as seen in the SEM, so all calculations were based on the diameter determined before Pt bonding. Scale bar is 10 nm. Panel B shows the thermal conductance of an EE Si nanowire after first bonding with Pt in the FIB (solid squares). The sample broke near one of the pads and was re-bonded at the ends with significant Pt-C deposition over the gap. The conductance measurement after this second bonding (open squares) coincides with the first measurement. Hence, the Pt deposition at the wire ends is a good thermal anchor, but does not contribute significantly to thermal conduction along the wire. Panel C shows the k of 197 and 257 nm $SiO_2$ nanowires (open squares and open triangles, respectively) compare quantitatively to that of bulk $SiO_2$ (solid squares).

This deposition is in the form of a Pt-carbon composite, is due to low intensity secondary electron emission away from the irradiated region, and is unavoidable. FIG. 4, Panel A shows a TEM of such deposition on two bridging Si nanowires near the midpoint between both membranes. The Pt is deposited in the form of nanoparticles embedded in an amorphous carbon matrix—a product of the metal-organic precursor decomposition. The nanoparticles do not form a continuous film, and the contribution of the Pt-carbon composite to thermal conductance is negligible, as demonstrated by repeated bonding and excess deposition on the same nanowire after a first measurement (FIG. 4, Panel B). The temperature-dependent thermal conductivity from both measurements is the same.

Calibration of Nanowire Measurements.

To demonstrate the accuracy of these thermal transport experiments, the k of SiO$_2$ nanowires was measured with this apparatus. SiO$_2$ nanowires were prepared by dry oxidation of VLS-grown Si nanowires at 1000° C. for 24 hours. TEM analysis of the oxidized wires showed no crystalline material remaining and energy dispersive X-ray spectroscopy confirmed the presence of abundant O within the nanowires. The k of these wires (FIG. 4, Panel C) is very close to that of bulk amorphous SiO$_2$, which was expected since the mean free path of phonons approaches that of the interatomic spacing in an amorphous solid. Consequently, no increased boundary scattering was observed as compared to bulk.

Resistivity Measurement.

Figure 5:
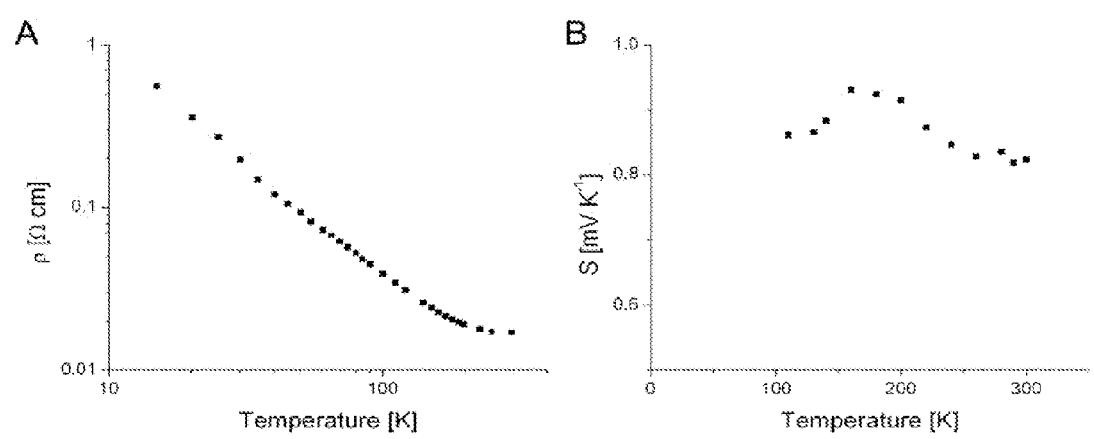
FIG. 5 shows the electrical transport measurements. The nanowires are shown by the hatched rectangles. Panel A shows the resistivity of the As-doped Si (100) wafer used for synthesis of the highly doped EE Si nanowires. Panel B shows the Seebeck coefficient of the As-doped Si (100) wafer used for synthesis of the highly doped EE Si nanowires.

A chip (1×1 cm) of the wafer from which nanowires were etched was sonicated in acetone and 2-propanol and stripped of its native oxide in a 30 sec. buffered HF bath. After rinsing in de-ionized water for 15 sec., the wafer was immediately transferred to a high-vacuum thermal evaporation chamber. 20 nm Ti and 20 nm Au were deposited onto only the corners of the Si chip by masking the rest with aluminum foil. Afterwards, an additional ~300 nm of Au was deposited by sputtering. The chip was then rapid thermal annealed for 3 min. at 450° C. Indium was used to wire bond external contacts onto the chip, and the temperature-dependent resistivity was experimentally determined by a Hall measurement (FIG. 5, Panel A). This resistivity corresponds to a doping concentration of $1.7 \times 10^{18}$ cm$^{-3}$. For ZT determination, temperature points between experimentally measured values were extrapolated by linear interpolation.

Seebeck measurement. The Seebeck coefficient (S) of bulk silicon was measured in a home-built cryostat setup by fixing a chip (1×2 cm) between two thermoelectric (TE) devices separated by a 3 mm gap. Heating one TE device while cooling the other one generated a temperature gradient (ΔT) along the length sample. A Lakeshore Model 331 temperature controller and two T-type thermocouples (Copper-Constantan, Omega Model 5SRTC) affixed to each end of the chip were used to measure ΔT. A Keithley Model 2400 source meter controlled power of the TE devices, and ΔT across the sample was maintained at less than 2 K. To measure the thermoelectric voltage (ΔV) of the sample, a Keithley Model 2001 multimeter was connected to the two copper probes of the thermocouples. S of the Si sample was calculated by S=−ΔV/ΔT. S of Cu (~6 uV/K) is less than 1% of that of Si and is neglected in the calculation. The measured Seebeck coefficient (FIG. 5, Panel B) agrees well with literature data (Geballe, T. H. & Hull, G. W. Seebeck effect in silicon. *Phys. Rev.*, 98, 940 (1955); Brinson, M. E. & Dunstan, W. Thermal conductivity and thermoelectric power of heavily doped n-type silicon. *J. Phys. C* 3, 483-491 (1970); van Herwaarden, A. W. The Seebeck effect in silicon Ics. *Sensors and Actuators*, 6, 245-254 (1984), which are hereby incorporated by reference in their entireties).

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

We claim:

1. A thermoelectric device, comprising:
a first electrode;
a second electrode; and
one or more silicon nanowires located between the first electrode and the second electrode;
wherein each of the one or more silicon nanowires is in electrical contact with the first electrode and the second electrode and has a mean surface roughness ranging from 1 nm to 5 nm.

2. The device of claim 1 wherein the each of the one or more silicon nanowires has a diameter of less than 300 nm.

3. The device of claim 1 wherein the each of the one or more silicon nanowires has a diameter of less than 200 nm.

4. The device of claim 1 wherein the each of the one or more silicon nanowires has a diameter of less than 100 nm.

5. The device of claim 1 wherein the each of the one or more silicon nanowires has a diameter of about 5 to 50 nm.

6. The device of claim 1 wherein the each of the one or more silicon nanowires is doped to a carrier density of at least about $10^{18}$ cm$^{-3}$.

7. The device of claim 1 wherein the each of the one or more silicon nanowires is doped to a carrier density of about $10^{19}$ cm$^{-3}$.

8. The device of claim 1 wherein:
the first electrode includes a first opaque material;
the second electrode includes a second opaque material; and
the first opaque material and the second opaque material are the same or different.

9. The device of claim 1 wherein the device is configured to generate an electric current.

10. The device of claim 9 wherein the device is further configured to generate the electric current flowing between the first electrode and the second electrode through the one or more silicon nanowires, in response to the first electrode and the second electrode being at different temperatures.

11. The device of claim 9 wherein the device is further configured to, in response to the first electrode being at a higher temperature than the second electrode, generate the electric current flowing from the first electrode to the one or more silicon nanowires and through the one or more silicon nanowires to the second electrode.

12. The device of claim 1 wherein the device is configured to provide thermal-electric cooling.

13. The device of claim 1 wherein the device is configured to provide thermal-electric heating.

14. A thermoelectric device, comprising:
a first electrode;
a second electrode;
a third electrode; and
one or more first silicon nanowires located between the first electrode and the second electrode; and
one or more second silicon nanowires located between the second electrode and the third electrode;
wherein:
each of the one or more first silicon nanowires is in electrical contact with the first electrode and the second electrode and has a mean surface roughness ranging from 1 nm to 5 nm;
each of the one or more second silicon nanowires is in electrical contact with the second electrode and the third electrode and has a mean surface roughness ranging from 1 nm to 5 nm.

15. The device of claim 14 wherein the device is configured to generate an electric current.

16. The device of claim 15 wherein the device is further configured to generate the electric current flowing between the first electrode and the third electrode through the one or more first silicon nanowires, the second electrode, and the one or more second silicon nanowires, in response to the second electrode being at a different temperature from the first electrode and the third electrode.

17. The device of claim 15 wherein the device is further configured to generate, in response to the second electrode being at a higher temperature than the first electrode and the third electrode, the electric current flowing from the third electrode to the one or more second silicon nanowires, through the one or more second nanostructures to the second electrode, through the second electrode to the one or more first silicon nanowires, and through the one or more first silicon nanowires to the first electrode.

18. The device of claim 14 wherein the one or more first silicon nanowires are doped with one or more valence-five elements.

19. The device of claim 14 wherein the one or more second silicon nanowires are doped with one or more valence-three elements.

20. The device of claim 14 wherein the device is configured to provide thermal-electric cooling.

21. The device of claim 14 wherein the device is configured to provide thermal-electric heating.

22. The device of claim 14 wherein:
the first electrode includes a first opaque material;
the second electrode includes a second opaque material; and
the first opaque material and the second opaque material are the same or different.

23. A thermoelectric device, comprising:
a first electrode;
a second electrode;
a third electrode; and
one or more silicon nanowires located between the first electrode and the second electrode; and
one or more thermal-electric structures located between the second electrode and the third electrode;
wherein:
each of the one or more silicon nanowires is in electrical contact with the first electrode and the second electrode and has a mean surface roughness ranging from 1 nm to 5 nm; and
each of the one or more thermal-electric structures is in electrical contact with the second electrode and the third electrode.

24. The device of claim 23 wherein the device is configured to generate an electric current.

25. The device of claim 24 wherein the device is further configured to generate the electric current flowing between the first electrode and the third electrode through the one or more silicon nanowires, the second electrode, and the one or more thermal-electric structures, in response to the second electrode being at a different temperature from the first electrode and the third electrode.

26. The device of claim 23 wherein the device is configured to provide thermal-electric cooling.

27. The device of claim 23 wherein the device is configured to provide thermal-electric heating.

28. The device of claim 23 wherein:
the first electrode includes a first opaque material;
the second electrode includes a second opaque material; and
the first opaque material and the second opaque material are the same or different.

\* \* \* \* \*